US012689392B2

(12) United States Patent
Akel et al.

(10) Patent No.: US 12,689,392 B2
(45) Date of Patent: Jul. 21, 2026

(54) ASSOCIATIVE COMPUTING FOR ERROR CORRECTION

(71) Applicant: Micron Technology, Inc., Boise, ID (US)

(72) Inventors: Ameen D. Akel, Rancho Cordova, CA (US); Helena Caminal, Ithaca, NY (US); Sean S. Eilert, Penryn, CA (US)

(73) Assignee: Micron Technology, Inc., Boise, ID (US)

( * ) Notice: Subject to any disclaimer, the term of this patent is extended or adjusted under 35 U.S.C. 154(b) by 33 days.

(21) Appl. No.: 18/679,022

(22) Filed: May 30, 2024

(65) Prior Publication Data

US 2024/0396573 A1 Nov. 28, 2024

Related U.S. Application Data

(63) Continuation of application No. 17/677,593, filed on Feb. 22, 2022, now Pat. No. 12,021,547.

(Continued)

(51) Int. Cl.
*H03M 13/15* (2006.01)
*G06F 11/10* (2006.01)
(Continued)

(52) U.S. Cl.
CPC ..... *H03M 13/1575* (2013.01); *G06F 11/1068* (2013.01); *G11C 15/04* (2013.01); *H03M 13/43* (2013.01)

(58) Field of Classification Search
CPC .............. H03M 13/1575; H03M 13/43; G06F 11/1068; G11C 15/00; G11C 15/04
(Continued)

(56) References Cited

U.S. PATENT DOCUMENTS 6,067,656 A     5/2000 Rusu et al.
7,246,300 B1 *  7/2007 Au ...................... G06F 11/1064
                                                  714/763

(Continued)

FOREIGN PATENT DOCUMENTS

KR     10-2020-0140167 A     12/2020

OTHER PUBLICATIONS

"International Search Report and Written Opinion of the International Searching Authority," issued in connection with Int'l Appl. No. PCT/US2022/081550, dated Apr. 19, 2023 (12 pages).

(Continued)

*Primary Examiner* — Albert Decady
*Assistant Examiner* — Enam Ahmed
(74) *Attorney, Agent, or Firm* — Holland & Hart LLP

(57) ABSTRACT

Methods, systems, and devices for associative computing for error correction are described. A device may receive first data representative of a first codeword of a size for error correction. The device may identify a set of content-addressable memory cells that stores data representative of a set of codewords each of which is the size of the first codeword. The device may identify second data representative of the first codeword in the set of content-addressable memory cells. Based on identifying the second data, the device may transmit an indication of a valid codeword that is mapped to the second data.

18 Claims, 10 Drawing Sheets

Related U.S. Application Data

(60) Provisional application No. 63/294,190, filed on Dec. 28, 2021.

(51) Int. Cl.
G11C 15/04 (2006.01)
H03M 13/43 (2006.01)

(58) Field of Classification Search
USPC ......................................................... 714/758
See application file for complete search history.

(56) References Cited

U.S. PATENT DOCUMENTS

| | | | | |
|---|---|---|---|---|
| 8,769,374 | B2 | 7/2014 | Franceschini et al. | |
| 8,908,407 | B1 | 12/2014 | Haukness et al. | |
| 9,362,962 | B2 * | 6/2016 | Simpson ............... | G06F 13/385 |
| 9,929,818 | B2 * | 3/2018 | Holden ............... | H04L 25/0292 |
| 2005/0010719 | A1 | 1/2005 | Slavin | |
| 2005/0289295 | A1 | 12/2005 | Shoham et al. | |
| 2007/0061668 | A1 | 3/2007 | Wickeraad et al. | |
| 2009/0271570 | A1 | 10/2009 | Burns et al. | |
| 2014/0223258 | A1 | 8/2014 | Hartwich et al. | |
| 2015/0095738 | A1 * | 4/2015 | Zampaglione ........ | H03M 13/13 |
| | | | | 714/764 |
| 2016/0134307 | A1 * | 5/2016 | Hu ...................... | G06F 11/1048 |
| | | | | 714/758 |
| 2017/0147499 | A1 | 5/2017 | Mohan et al. | |
| 2018/0373590 | A1 | 12/2018 | Higgins et al. | |
| 2019/0146873 | A1 * | 5/2019 | Wu ...................... | G06F 11/1048 |
| | | | | 714/764 |
| 2021/0019147 | A1 | 1/2021 | Studer et al. | |
| 2021/0064455 | A1 | 3/2021 | Akel et al. | |
| 2021/0065798 | A1 * | 3/2021 | Pawlowski ......... | G06F 12/1036 |
| 2021/0303211 | A1 | 9/2021 | Moon | |
| 2022/0107888 | A1 | 4/2022 | Berger et al. | |

OTHER PUBLICATIONS

A. E. Slade and H. O. McMahon, "A cryotron catalog memory system," in Eastern Joint Computer Conference: New Developments in Computers, 1957.

A. Morad, L. Yavits, S. Kvatinsky, and R. Ginosar, "Resistive GP-SIMD processing-in-memory," ACM Trans. Archit. Code Optim., 2016.

C. C. Foster, Content Addressable Parallel Processors. John Wiley & Sons, Inc., 1976.

G. E. Sayre, "Staran: An associative approach to multiprocessor architecture," in Computer Architecture. Springer Berlin Heidelberg, 1976.

Helena Caminal, Kailin Yang, Srivatsa Srinivasa, Akshay Ramanathan, Khalid Al-Hawaj, Tianshu, Wu, Vijay Narayanan, Christopher Batten, Jos e Mart nez, \Cape: A Content-Addressable Processing Engine, The 27th IEEE International Symposium on High-Performance Computer Architecture (HPCA-27), Feb. 2021, Seoul, South Korea.

K. Pagiamtzis and A. Sheikholeslami, "Content-addressable memory (CAM) circuits and architectures: a tutorial and survey," IEEE Journal of Solid-State Circuits, 2006.

L. Yavits, A. Morad, and R. Ginosar, "Computer architecture with associative processor replacing last-level cache and simd accelerator," IEEE Transactions on Computers, 2015.

S. Jeloka, N. B. Akesh, D. Sylvester, and D. Blaauw, "A 28 nm configurable memory (TCAM/BCAM/SRAM) using push-rule 6t bit cell enabling logic-in-memory," IEEE Journal of Solid-State Circuits, 2016.

Y. Zha and J. Li, "Hyper-AP: Enhancing associative processing through a full-stack optimization," in 2020 ACM/IEEE 47th Annual International Symposium on Computer Architecture, 2020.

* cited by examiner

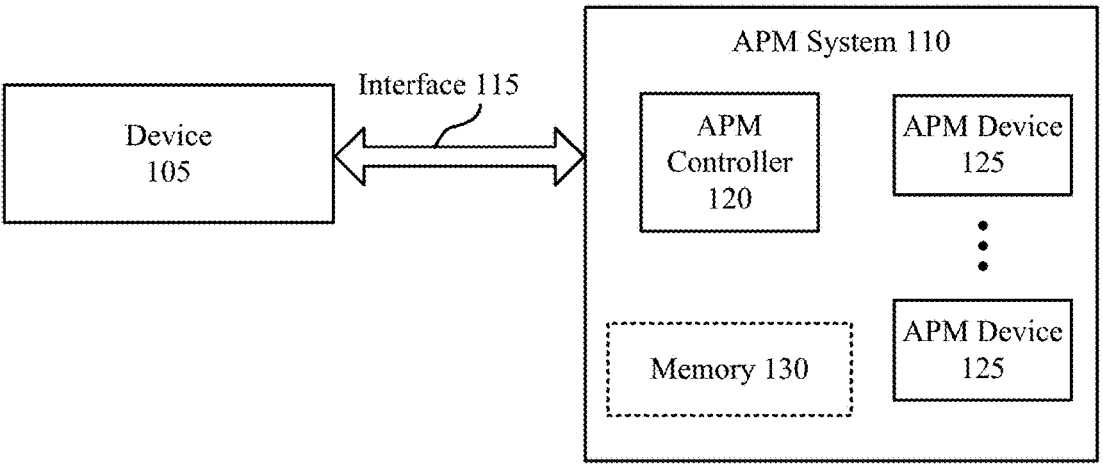
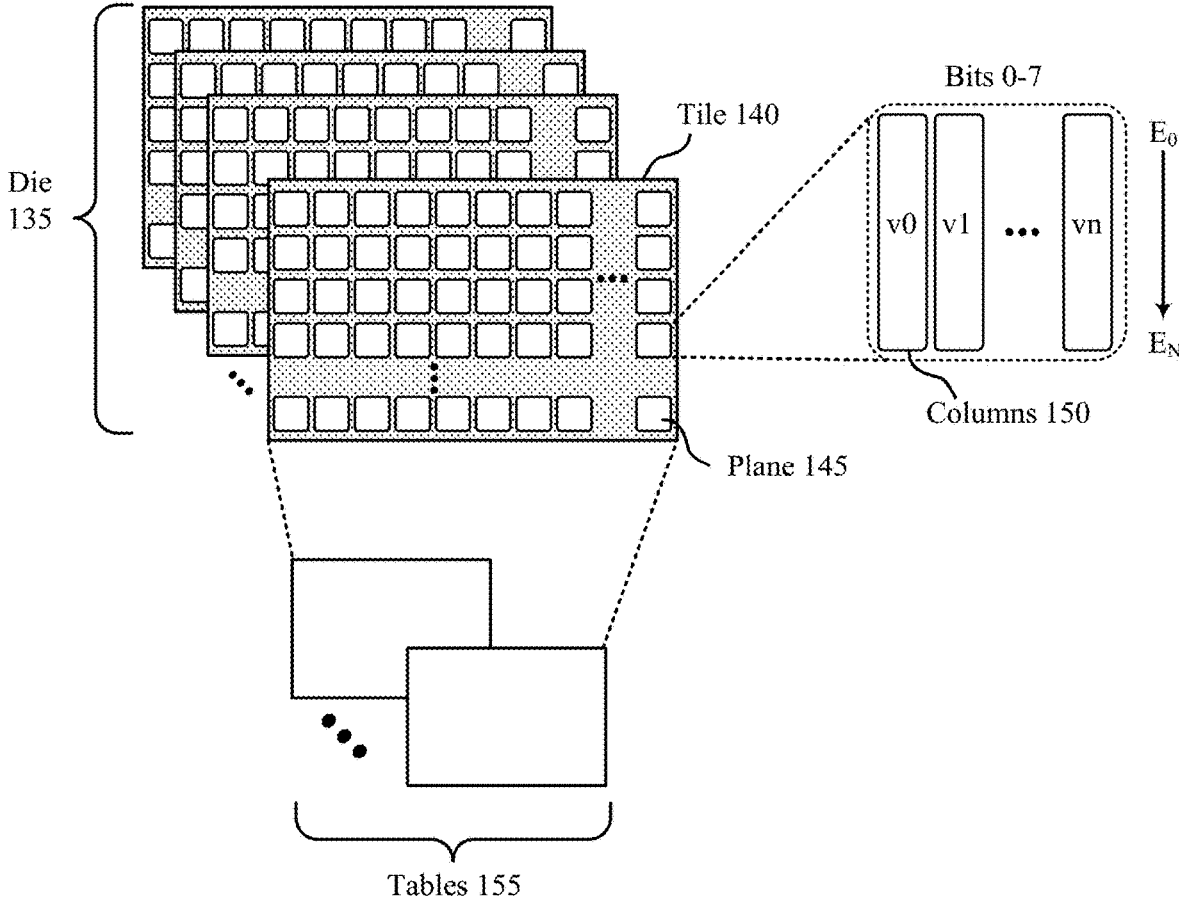
FIG. 1

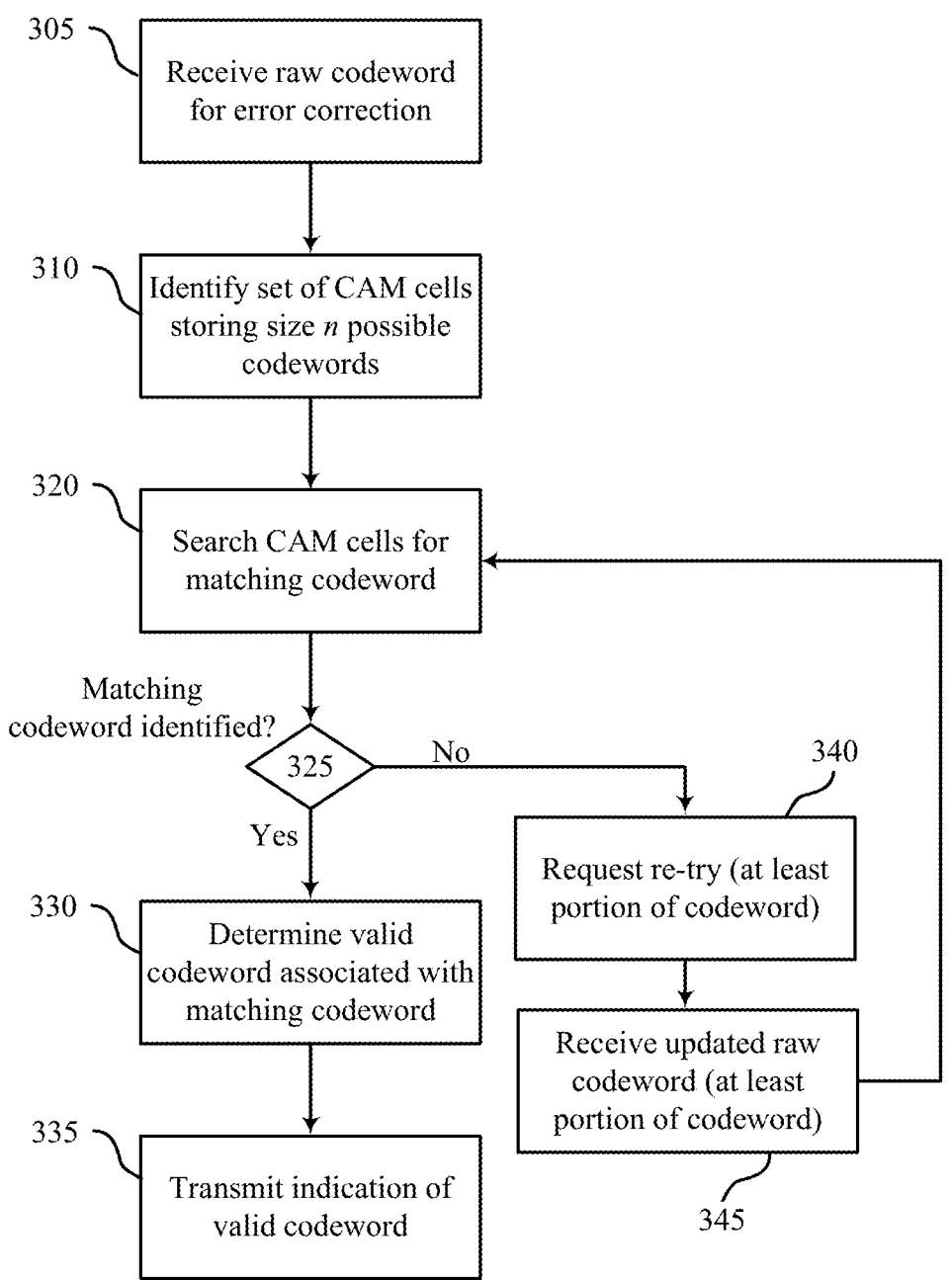

305 — Receive raw codeword for error correction

310 — Identify set of CAM cells storing size *n* possible codewords

320 — Search CAM cells for matching codeword

Matching codeword identified?

325

No

Yes

340 — Request re-try (at least portion of codeword)

330 — Determine valid codeword associated with matching codeword

Receive updated raw codeword (at least portion of codeword)

335 — Transmit indication of valid codeword

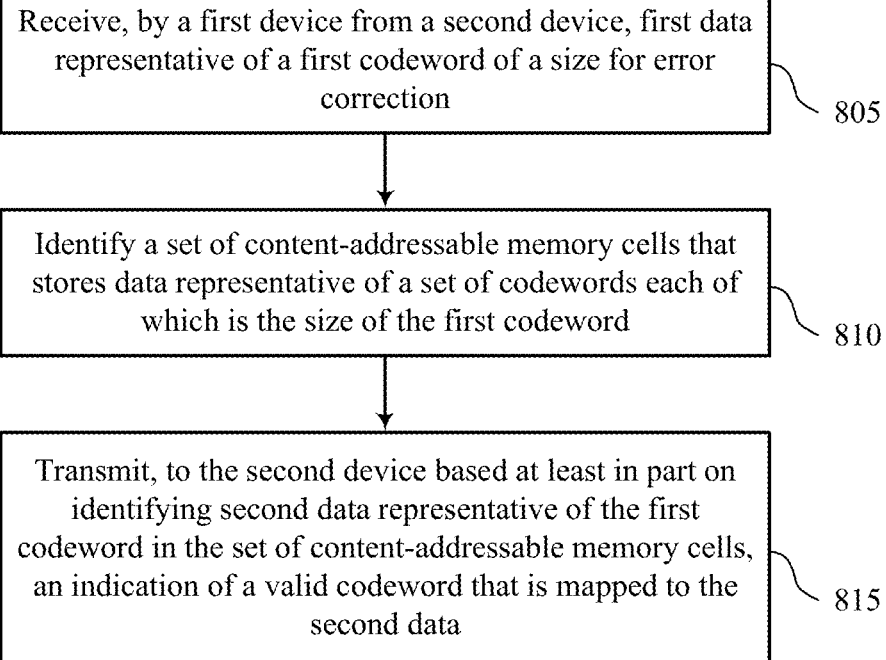

Receive, by a first device from a second device, first data representative of a first codeword of a size for error correction

805

Identify a set of content-addressable memory cells that stores data representative of a set of codewords each of which is the size of the first codeword

810

Transmit, to the second device based at least in part on identifying second data representative of the first codeword in the set of content-addressable memory cells, an indication of a valid codeword that is mapped to the second data

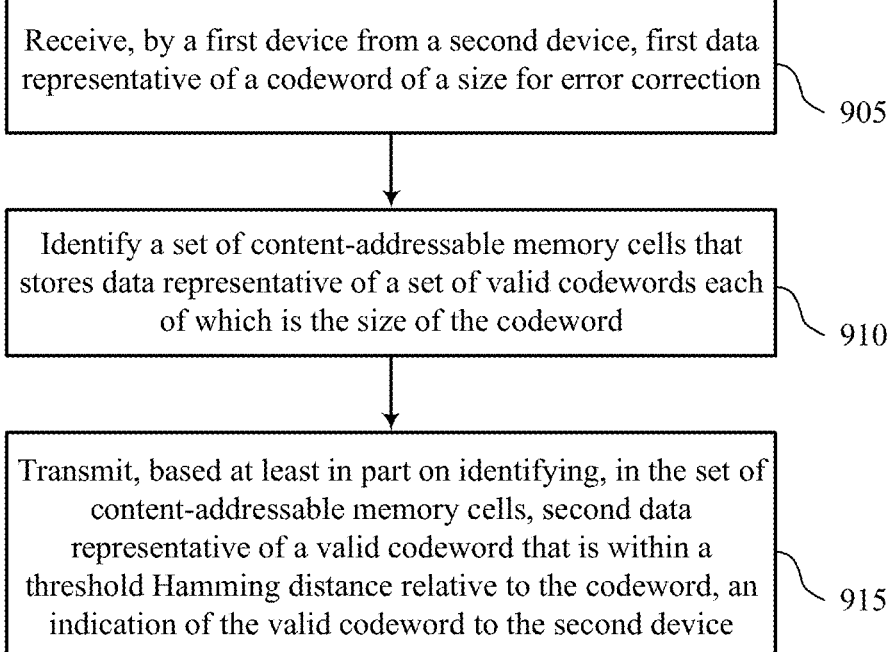

Receive, by a first device from a second device, first data representative of a codeword of a size for error correction

905

Identify a set of content-addressable memory cells that stores data representative of a set of valid codewords each of which is the size of the codeword

910

Transmit, based at least in part on identifying, in the set of content-addressable memory cells, second data representative of a valid codeword that is within a threshold Hamming distance relative to the codeword, an indication of the valid codeword to the second device

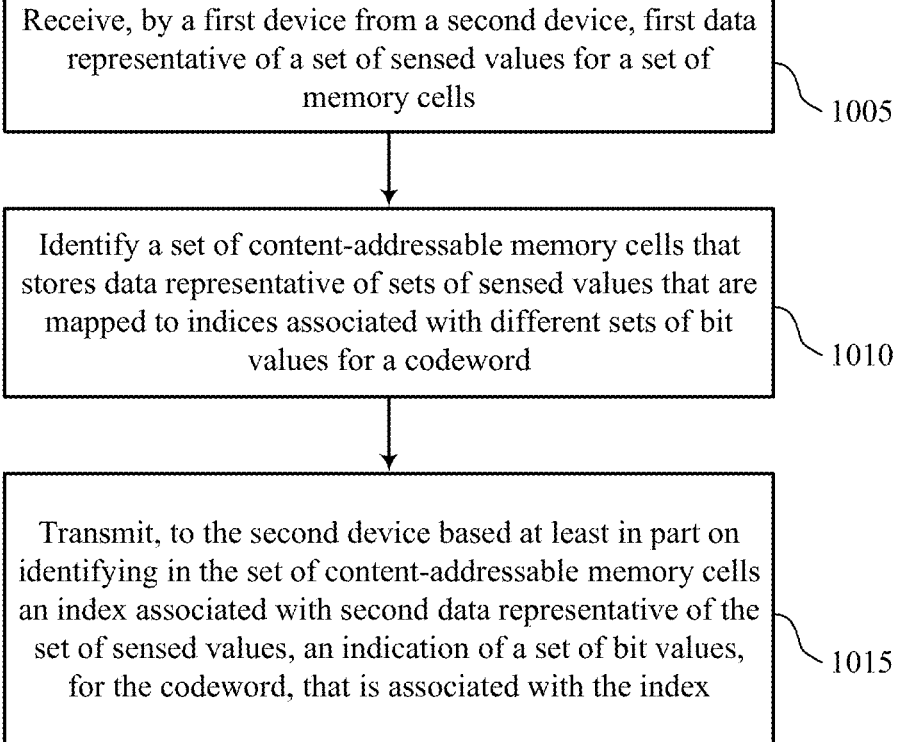

Receive, by a first device from a second device, first data representative of a set of sensed values for a set of memory cells
1005

Identify a set of content-addressable memory cells that stores data representative of sets of sensed values that are mapped to indices associated with different sets of bit values for a codeword
1010

Transmit, to the second device based at least in part on identifying in the set of content-addressable memory cells an index associated with second data representative of the set of sensed values, an indication of a set of bit values, for the codeword, that is associated with the index
1015

ASSOCIATIVE COMPUTING FOR ERROR CORRECTION

CROSS REFERENCE

The present application for patent is a continuation of U.S. patent application Ser. No. 17/677,593 by Akel et al., entitled "ASSOCIATIVE COMPUTING FOR ERROR CORRECTION," filed Feb. 22, 2022, which claims the benefit of U.S. Provisional Patent Application No. 63/294,190 by AKEL et al., entitled "ASSOCIATIVE COMPUTING FOR ERROR CORRECTION," filed Dec. 28, 2021, each of which is assigned to the assignee hereof, and each of which is expressly incorporated by reference in its entirety herein.

FIELD OF TECHNOLOGY

The following relates generally to one or more systems for memory and more specifically to associative computing for error correction.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

BRIEF DESCRIPTION OF THE DRAWINGS

FIG. 1 illustrates an example of a system that supports associative computing for error correction in accordance with examples as disclosed herein.

FIG. 3 illustrates an example of a process flow that supports associative computing for error correction in accordance with examples as disclosed herein.

FIGS. 8 through 10 show flowcharts illustrating a method or methods that support associative computing for error correction in accordance with examples as disclosed herein.

DETAILED DESCRIPTION

Figure 2:
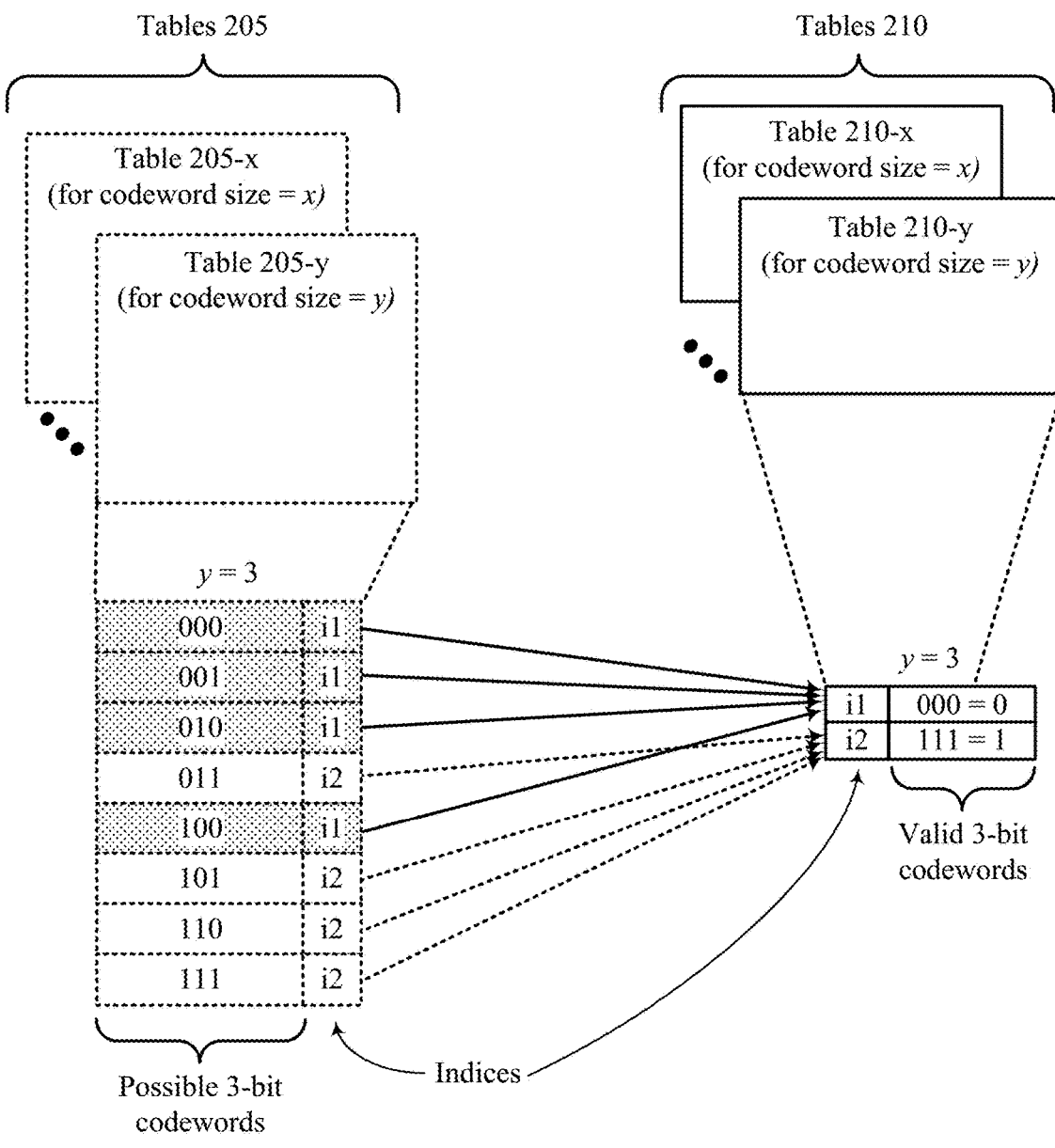
FIG. 2 illustrates an example of tables that support associative computing for error correction in accordance with examples as disclosed herein.

In some systems, a host device may offload (e.g., shift, assign) various processing tasks to an electronic device, such as an accelerator. For example, a host device may offload vector computations to the electronic device, which may use compute engines and processing techniques to perform the vector computations. This offloading of vector computations may involve communication of vectors or vector information from the host device to the electronic device, and in turn communication of results from the electronic device to the host device. A bandwidth of the electronic device may be constrained by the communication interface between the electronic device and the host device, and may be constrained by the size and serial processing of the compute engines. According to the techniques described herein, a host device may essentially increase processing bandwidth by offloading processing tasks to an associative processor memory (APM) system that uses, among other aspects, in-memory associative processing to perform vector computations in parallel.

In addition to, or alternative to, performing vector computations, the APM system may be used as an error correction engine. For example, the APM system may receive a raw (e.g., uncorrected) codeword, for example, that has been read from a device (e.g., another device), such as a host device or a memory device. The APM system may use information (e.g., tables) stored in content addressable memory (CAM) arrays of the APM system to determine a valid codeword that corresponds to the raw codeword.

In a first example, the APM system may use the CAM array to store information (e.g., a table) that includes possible codewords for a given codeword size. The information (e.g., table) may indicate a mapping between the codewords and the valid codewords, which are codewords supported by the other device (e.g., codewords that an encoding function of the device supports). The valid codewords may be stored in another location (e.g., another table) of the CAM array and may be distinct from each other, for example, may be separated from each other by a Hamming distance that is greater than a threshold Hamming distance, where the Hamming distance refers to number of digit positions in which the corresponding digits of two codewords of the same length are different). Upon receipt of a raw codeword of a given size, the APM system may look-up the raw codeword in the location (e.g., the table) that includes the possible codewords for that size and identify a matching codeword. The APM system may then identify the valid codeword mapped to the matching codeword. For example, the entry for the matching codeword may include an index to the table that has the valid codewords. Upon identifying the valid codeword, the APM system may transmit an indication of the valid codeword to the device.

In a second example, the APM system may store information, such as the table, of valid codewords (e.g., in some examples the table including or consisting of valid codewords and not other codewords). In this example, the APM system may search the information (e.g., the table) for a valid codeword that is within the threshold Hamming distance of the raw codeword. Upon identifying the valid codeword that is within the threshold Hamming distance of the raw codeword, the APM system may transmit an indication of the valid codeword to the device.

In some examples, the APM system may additionally or alternatively be configured to determine a valid codeword that corresponds to a set of sensed values from the device. For example, the APM may receive from the device a set of values, such as analog values, that represent sensed values for a set of memory cells. The APM system may determine bit values for valid codewords, for example the APM system may look-up the analog values in a table that maps analog values to indices that are associated with bit values for valid codewords. Upon identifying the bits values associated with the index mapped to the set of analog values, the APM system may indicate the bit values to the device.

Although described as entries in a table, the codewords described herein may be described as sets of codewords that may be stored in one or more sets of one or more memory cells. Similarly, although described as entries in a table, the sets of sensed values described herein may be described as one or more sets of one or more sensed values that are stored in one or more sets of one or more memory cells.

Features of the disclosure are initially described in the context of a system as described with reference to FIG. 1. Features of the disclosure are described in the context tables and process flows as described with reference to FIGS. 2-6. These and other features of the disclosure are further illustrated by and described with reference to an apparatus diagram and flowcharts that relate to associative computing for error correction as described with reference to FIGS. 7-10.

FIG. 1 illustrates an example of a system 100 that supports associative computing for error correction in accordance with examples as disclosed herein. The system 100 may include a device 105 and an associative processing memory (APM) system 110. The device 105 may interact with (e.g., communicate with, control) the APM system 110 as well as other components of the device that includes the APM system 110. In some examples, the device 105 and the APM system 110 may interact over the interface 115, which may be an example of a Compute Express Link (CXL) interface or other type of interface. The device 105 may be a host device, a memory system, or other device capable of interacting with the APM system 110.

In some examples, the system 100 may be included in, or coupled with, a computing device, an electronic device, a mobile computing device, or a wireless device. The device may be a portable electronic device. For example, the device may be a computer, a laptop computer, a tablet computer, a smartphone, a cellular phone, a wearable device, an internet-connected device, or the like. The device 105 may be or include a system-on-a chip (SoC), a memory system (e.g., a solid state drive (SSD), an SSD channel, a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In some examples, the device 105 may be referred to as a host, a host system, or other suitable terminology.

The APM system 110 may operate as an accelerator (e.g., a high-speed processor) for the device 105 so that the device 105 can offload various processing tasks to the APM system 110, which may be configured to execute the processing tasks faster than the device 105. For example, the device 105 may send a program (e.g., a set of instructions, such as Reduced Instruction Set V (RISC-V) vector instructions) to the APM system 110 for execution by the APM system 110. As part of the program, or as directed by the program, the APM system 110 may perform various computational operations on vectors (e.g., the APM system 110 may perform vector computing). A computational operation may refer to a logic operation, an arithmetic operation, or other types of operations that involve the manipulation of vectors. A vector may include one or more elements each having a respective quantity of bits. The length or size of a vector may refer to the quantity of elements in the vector and the length or size of an element may refer to the quantity of bits in the element.

The APM controller 120 may be configured to interface with the device 105 on behalf of the APM devices 125. Upon receipt of a program from the device 105, the APM controller 120 may parse the program and direct or otherwise prompt the APM devices 125 to perform various computational operations associated with or indicated by the program. In some examples, the APM controller 120 may retrieve (e.g., from the memory 130) the vectors for the computational operations and may communicate the vectors to the APM devices 125 for associative processing. In some examples, the APM controller 120 may indicate the vectors for the computational operations to the APM devices 125 so that the APM devices 125 can retrieve the vectors from the memory 130. In some examples, the device 105 may provide the vectors to the APM system 110. So, the memory 130 may be configured to store vectors that are accessible by the APM controller 120, the APM device 125, the device 105, or a combination thereof.

The vectors for computational operations at the APM devices 125 may be indicated by (or accompanied by) the program received from the device 105 or by other control signaling (e.g., other separate control signaling) associated with the program. For example, a program that indicates a computational operation for a pair of vectors may include one or more addresses (or one or more pointers to one or more addresses) of the memory 130 where the vectors are stored. Although shown included in the APM system 110, the memory 130 may be external to, but nonetheless coupled with, the APM system 110. Although shown as a single component, the functionality of memory 130 may be provided by multiple memories 130.

The APM devices 125 may include memory cells, such as content-addressable memory (CAM) cells that are configured to store vectors (e.g., vector operands, vector results) associated with computational operations. A vector operand may be a vector that is an operand for a computational operation (e.g., a vector operand may be a vector upon which the computation operation is executed). A vector result may be a vector that results from a vector computation.

The APM system 110 may be configured to store information, such as truth tables, for various computational operations, where information (e.g., a truth table) for a given computational operation may indicate results of the computational operation for various combinations of logic values. For example, the APM system 110 may store information (e.g., one or more truth tables) for logic operations (e.g., AND operations, OR operations, XOR operations, NOT operations, NAND operations, NOR operations, XNOR operations) as well as arithmetic operations (e.g., addition operations, subtraction operations), among other types of operations. Memory cells that store information (e.g., one or more truth tables) for a computational operation may store the various combinations of logic values for the operands of the computational operation as well as the corresponding results and carry bits, if applicable, for each combination of logic values. The APM system 110 may store truth tables for associative processing in one or more memories (e.g., in one or more on-die mask ROM(s)) which may be coupled with or included in the APM system 110. For example, the truth tables may be stored in the memory 130, in local memories of the APM devices 125, or both. In either example, an APM device 125 may cache common instructions on-device (e.g., instead of fetching them or receiving them).

At least some APM devices 125, if not each APM device 125, may use associative processing to perform computational operations on the vectors stored in that APM device 125. Unlike serial processing (where vectors are moved back and forth between a processor and a memory), associative processing may involve searching and writing vectors in-memory (also referred to as "in-situ"), which may allow for parallelism that increases processing bandwidth. Performance of computational operations in-situ may also allow the system 100 to, among other advantages, avoid the bottleneck at the interface between the device 105 and the APM system 110, which may reduce latency and power consumption compared to other processing techniques, such as serial processing. Associative processing may also be referred to as associative computing or other suitable terminology.

In some examples, an APM device 125 that uses associative processing to perform a computational operation may leverage information, such as a truth table, to execute the computational operation in a bit-wise manner using, for example, a "search and write" technique. For example, if the APM device 125 includes CAM cells that store vector operands for a computational operation, the APM device 125 may search the CAM cells for bits of the vector operands that match an entry of the truth table corresponding to that computational operation, determine the result of the computational operational for the bits based on the matching entry of the truth table, and write the result back in the CAM. The APM device 125 may then proceed to the next significant bits for the vectors and use associative processing to perform the computational operation on those bits. In some examples, the computational operation for bits may involve a carry bit that was determined as part of the computational operation on less significant bits.

Each APM device 125 may include one or more dies 135, which may also be referred to as memory dies, semiconductor dies, or other suitable terminology. A die 135 may include multiple tiles 140, which in turn may each include multiple planes 145. In some examples, the tiles 140 may be configured such that a single plane 145 per tile is operable or activatable at a time (e.g., one plane per tile may perform associative computing at a time). However, any quantity of tiles 140 may be active at a time (e.g., any quantity of tiles may be performing associative computing at a time). Thus, the tiles 140 may be operated in parallel, which may increase the quantity of computational operations that can be performed during a time interval, which in turn may increase the bandwidth of an APM device 125 relative to other different techniques. Use of multiple APM devices 125, as opposed to a single APM device 125, may further increase the bandwidth of the APM system 110 relative to other systems. Each APM device 125 may include a local controller or logic that controls the operations of that APM device 125.

Each plane 145 may include a memory array that includes memory cells, such as CAM cells. The memory cells in a memory array may be arranged in columns and rows and may be non-volatile memory cells or volatile memory cells. A memory array that includes CAM cells may be configured to search the CAM cells by content as opposed to by address. For example, a memory array that includes CAM cells storing vectors for a computational operation may compare the logic values of the operand bits of the vectors with entries from a truth table associated with the computational operation to determine which results correspond to those logic values.

As noted, an APM device 125 may be configured to store vectors associated with computational operations in the memory cells of that APM device 125. To aid in associative processing, the vectors may be stored in a columnar manner across multiple planes. For example, given a vector v0 that has multiple n-bit (e.g., n=32) elements (denoted $E_0$ through $E_N$), an APM device 125 may divide each element into sets of contiguous bits (e.g., four sets of eight contiguous bits). The APM device 125 may store the first set of contiguous bits (e.g., the least significant set of contiguous bits) for each element of vector v0 in a first plane 145, where each row of the plane 145 stores the first set of contiguous bits for a respective element of the vector v0. Thus, in some examples, the columns 150 may store the first eight bits of each element of the vector v0 (e.g., the columns 150 may span eight columns). In a similar manner, the APM device 125 may store the next significant set of contiguous bits from each element of the vector v0 in a second plane 145. And so on and so forth for the remaining sets of contiguous bits for the vector v0. Thus, the vector v0 may be stored in a columnar manner across multiple planes. The bits of other vectors v1 through vn may be stored in a similar columnar manner across the planes 145.

Spreading vectors across multiple planes using the columnar storage technique may allow an APM device 125 to store more vectors per plane 145 relative to other techniques, which in turn may allow the APM device 125 to operate on more combinations of vectors compared to the other techniques. For example, consider a plane that is 256 rows by 256 columns. Rather than storing eight vectors with 32-bit elements across a single plane, which may limit the APM device 125 to operating on those eight vectors (absent time-consuming vector movement), the APM device 125 may store 32 vectors with 32-bit elements across four planes, which allows the APM device 125 to operate on those 32 bit vectors (e.g., one plane at a time) without performing time-consuming vector movement.

In some examples, the APM devices 125 may store vectors according to a vector mapping scheme, which may be one of multiple vector mapping schemes supported by the APM devices 125. A vector mapping scheme may refer to a scheme for mapping (and writing) vectors to planes 145 of an APM device 125. For example, an APM device 125 may support a first vector mapping scheme, referred to as vector mapping scheme 1, and a second vector mapping scheme, referred to as vector mapping scheme 2. In vector mapping scheme 1, a vector may be spread across planes of the same tile 140. In vector mapping scheme 2, a vector may be spread across planes of different tiles 140. A vector mapping scheme may also be referred to as a storage scheme, a layout scheme, or other suitable terminology.

The APM system 110 may select between the vector mapping schemes before writing vectors to the APM devices 125 according the selected vector mapping scheme. For example, the APM system 110 may select the vector mapping scheme for a set of computational operations based on the sizes of the vectors associated with the set of computational operations, the types of the computations operations (e.g., arithmetic versus logic) in the set of computational operations, a quantity of the computational operations in the set, or a combination thereof, among other aspects. In some examples, the APM system 110 may select the vector mapping scheme in response to an indication of the vector mapping scheme provided by the device 105. For example, the device 105 may indicate the vector mapping scheme associated with a set of instructions for the set of computational operations. After vectors have been written to the APM devices 125 according to the selected vector mapping scheme, the APM devices 125 may use associative processing to perform computational operations on the vectors in accordance with the selected vector mapping scheme. Alternatively, a compiler or pre-processor may determine the vector mapping scheme.

The associative processing techniques described herein may be implemented by logic at the APM system 110, by logic at the APM devices 125, or by logic that is distributed between the APM system 110 and the APM devices 125. The logic may include one or more controllers, access circuitry, communication circuitry, or a combination thereof, among other components and circuits. The logic may be configured to perform aspects of the techniques described herein, cause components of the APM system 110 and/or the APM devices 125 to perform aspects of the techniques described herein, or both.

In addition to, or alternative to, performing computational operations for the device 105, the APM system 110 may be configured to perform error correction operations for the device 105. For example, one or more of the dies 135 may store tables 155, which the APM system 110 may leverage to determine valid codewords for the device 105. Storing a table may refer to storing the entries of the table in a set of memory cells distributed across one or more dies 135.

In some examples, the tables 155 may include, for some if not each codeword size supported by the device 105, a first table that includes possible codewords for a given size codeword and a second table that includes the valid codewords for the given size codeword. The first table may indicate a mapping between the codewords in the first table and valid codewords in the second table. If the tables 155 include both the first table and the second table for a given codeword size, the APM system 110 may search the first table for a codeword that matches a raw codeword of the size, identify the valid codeword mapped to the matching codeword, and indicate the valid codeword to the device 105. However, in some examples, the tables 155 may only include the second table (e.g., the tables 155 may exclude the first table). If the tables 155 only include the second table for a given codeword size, the APM system 110 may search the second table for a valid codeword that is within a threshold Hamming distance of the raw codeword and indicate the valid codeword to the device 105.

In addition to, or alternative to, performing error correction operations, the APM system 110 may be configured to perform codeword resolution for the device 105, where codeword resolution refers to determining bit values (for a codeword) that correspond to a set of sensed values. To support codeword resolution, the tables 155 may include tables that include sets of sensed values that are mapped to indices that are associated with bit values for valid codewords. In such a scenario, the APM system 110 may receive a set of sensed values from the device 105. The sensed values may be for memory cells at the device 105. The APM system 110 may search the tables 155 for a stored set of sensed values that matches the received set of sensed values, identify an index mapped to the stored set of sensed values, and indicate to the device 105 the set of codeword bit values associated with the index.

FIG. 2 illustrates example tables 200 that support associative computing for error correction in accordance with examples as disclosed herein. The tables 200 may include tables 205 and tables 210. The tables 205 may include tables 205-$x$ through 205-$y$ and the tables 210 may include tables 210-$x$ through 210-$y$. The tables 200 may be an example of the tables 155 and may be stored by an APM device, an APM system, or the like. For example, the APM device or system may include sets of CAM cells that store the tables (e.g., for a given table, a set of CAM cells may store the table entries as one or more vectors).

Each table 205 may include codewords (e.g., possible, but not necessarily valid codewords) of a particular size, where the size of a codeword refers to the quantity of bits in the codeword. For example, table 205-$x$ may include codewords of size x, and table 205-$y$ may include codewords of size y, where x and y are different. Framed another way, table 205-$x$ may represent a set of CAM cells that stores codewords of size x, and table 205-$y$ may represent a set of CAM cells that stores codewords of size y. In addition to storing codewords of a particular size, a set of CAM cells may store indices that map the codewords to valid codewords (e.g., the valid codewords stored in the tables 210).

Each table 210 may include valid codewords (e.g., all valid codewords) of a particular size. For example, table 210-$x$ may include valid codewords of size x, and table 210-$y$ may include valid codewords of size y, where x and y are different. Framed another way, table 210-$x$ may represent a set of CAM cells that stores valid codewords of size x, and table 210-$y$ may represent a set of CAM cells that stores valid codewords of size y. In addition to storing valid codewords of a particular size, a set of CAM cells may store indices that indicate and, in some examples, differentiate the valid codewords.

Valid codewords may refer to codewords that are supported by a device, such as the device 105. For example, valid codewords may be codewords that are supported by an encoding function at the device 105. The encoding function may be configured to encode data into valid codewords that are distinct, for examples, separated by a Hamming distance that is greater than (e.g., more than twice) a threshold Hamming distance. For example, given a threshold Hamming distance of z (such as one), the encoding function may be configured to encode data into valid codewords that are separated by a Hamming distance of z or more (such as three). The threshold Hamming distance for a codeword size may be equal to the quantity of errors the APM system is configured to detect for that codeword size.

As a simple encoding example, consider a single data bit with two possible values: 0 and 1. The device 105 may be configured to encode the single data bit so that the 0 value and the 1 value are represented by respective three-bit codewords that are separated by a Hamming distance of three (in the example where the APM system is configured to detect a single error). For example, the 0 value may be encoded into a three-bit codeword equal to '000' and the 1 value may be encoded into a three-bit codeword equal to '111.'

Encoding data so that valid codewords are separated by more than the threshold Hamming distance may allow the APM system to detect errors that are equal to, or greater than, the threshold Hamming distance.

Continuing the forgoing example, the codeword size y for table 205-$y$ may be equal to three. Thus, the table 205-$y$ may include possible three-bit codewords (e.g., the table 205-$y$ may include all eight permutations for three bits). For each possible codeword, the table 205-$y$ may indicate a mapping to a valid codeword. In some examples, the mapping may be determined by the APM system (e.g., during training) based on the Hamming distance between a codeword and a valid codeword. For example, the APM system may map to valid codeword '000' each possible codeword that is within a Hamming distance of one with respect to valid codeword '000'. Thus, the table 205-$y$ may indicate a mapping between valid codeword '000' and possible codewords '000,' '001,' '010,' and '100.' Similarly, the APM system may map to valid codeword '111' each possible codeword that is within a Hamming distance of one with respect to valid codeword '111'. Thus, the table 205-$y$ may indicate a mapping between valid codeword '111' and possible codewords '011,' '101,' '110,' and '111.'

So, there may be a many-to-one mapping between possible codewords in a table 205 and valid codewords in a corresponding table 210. The mappings between possible codewords and valid codewords may be indicated by indices, pointers, or other suitable techniques. For example, a first index (e.g., i1) may be used to indicate the mapping between valid codeword '000' and the possible codewords for valid codeword '000,' and a second index (e.g., i2) may be used to indicate the mapping between valid codeword '111' and the possible codewords for valid codeword '111.' The first index i1 may be stored in table 205-$y$ for each possible codeword that maps to valid codeword '000' and the second index i2 may be stored in table 205-$y$ for each possible codeword that maps to valid codeword '111.'

Continuing the foregoing example, consider receipt at the APM system of a three-bit raw codeword with an error. For instance, assume that the APM system receives a raw codeword equal to '001' that should be '000' (e.g., the raw codeword has an error in the least significant bit). In such an event, the APM system may search the table 205-$y$ to identify the possible codeword (e.g. '001') that matches (e.g., is equal to) the raw codeword. The APM system may then use the index associated with the possible codeword (e.g., i1), among other information, to identify a valid codeword (e.g., '000') mapped to the possible codeword. Thus, the APM system may identify the valid codeword corresponding to the raw codeword and in doing so may operate as an error correction engine for the device 105.

In some examples, the APM system may omit some or all of the tables 205. In such examples, the APM system may use the tables 210 to perform error correction. For example, given a raw codeword for error correction, the APM system may search the appropriate table 210 for a valid codeword, for example, a valid codeword that is within the threshold Hamming distance. To illustrate, assume that the APM system receives a raw codeword equal to '101' that should be '111' (e.g., the raw codeword has an error in the intermediate significant bit). In such an event, the APM system may search the table 210-$y$ to identify the valid codeword (e.g., '111') that is within the threshold Hamming distance of one with respect to the raw codeword. Thus, the APM system may identify the valid codeword corresponding to the raw codeword and in doing so operate as an error correction engine for the device 105.

Storing both the tables 205 and the tables 210 may simplify operations at the APM system relative to other techniques. However, omitting or excluding some or all of the tables 205 may reduce the amount of memory used for error correction relative to other techniques.

Although described with reference to a single threshold Hamming distance per codeword, the techniques described herein may be implemented with multiple threshold Hamming distances per codeword, among other parameters. For example, the middle portion of a codeword may be associated with a first threshold Hamming distance (e.g., one) and the end portions of the codeword may be associated with a second threshold Hamming distance (e.g., two). Use of multiple threshold Hamming distances for a codeword may allow the APM system to provide different levels of error protection to different portions of a codeword. In such a scenario, a table 205 may include possible codewords that satisfy the threshold Hamming distances (as opposed to including all possible codewords). For example, if a Hamming distance of zero is applied to the middle bit of a three-bit codeword and a Hamming distance of one is applied to the first and last bits, the table 205-$y$ may exclude possible codewords '010' and '101' (because neither codeword is within the threshold Hamming distance of zero for the middle bit).

FIG. 3 illustrates an example of a process flow 300 that supports associative computing for error correction in accordance with examples as disclosed herein. The process flow 300 may be implemented by a device such as an APM system or an APM device as described herein. The device may use CAM cells to store the entries of tables that the device uses to perform error correction operations. For example, the device may use CAM cells to store the entries of the tables 205 and the entries of the tables 210 as described with reference to FIG. 2. Storing both the entries of the tables 205 and the entries of the tables 210 may simplify operations at the device relative to other storage techniques. For example, storing both the entries of the tables 205 and the entries of the tables 210 may allow the device to search for a codeword that matches a raw codeword, which may be less complex than searching for a codeword that is within a threshold Hamming distance of a valid codeword.

At 305, the device may receive a raw (e.g., uncorrected) codeword from another device, such as the device 105. For example, the device may receive a raw codeword of size n, where n is the quantity of bits in the raw codeword. At 310, the device may identify a set of CAM cells that stores possible codewords of size n. The device may identify the set of CAM cells based on the size of the raw codeword and based on the size associated with the set of memory cells.

At 320, the device may search the set of CAM cells for a codeword that matches (e.g., is the same value as, is equal to) the raw codeword. For example, the device may compare codewords in the set of CAM cells with the raw codeword.

At 325, the device may determine whether a matching codeword has been identified in the set of CAM cells. If, at 325, the device determines that a matching codeword has been identified, the device may proceed to 330 and determine a valid codeword associated with (e.g., mapped to) the matching codeword. For example, the device may identify an index associated with the matching codeword and search a second set of content addressable memory cells (e.g., a second set of content addressable memory cells that stores the entries of a table 210 for size n) for a valid codeword associated with that index. The device may identify the second set of content-addressable based on the size n.

At 335, the device may send an indication of the valid codeword to the other device. For example, the device may send the index associated with the valid codeword or the valid codeword itself. In some examples, the device may also send the Hamming distance (e.g., so that the device 105 can determine whether the raw codeword is close to failing and if so, to implement remedial measures).

If, at 325, the device determines that a matching codeword has not been identified, the device may proceed to 340 and send to the other device a request for an updated raw codeword (or an updated portion of the raw codeword). At 345, the device may receive the updated raw codeword (or the updated portion of the raw codeword). The device may receive the updated raw codeword (or the updated portion of the raw codeword) based on (e.g., in response to) sending the request at 340. The device may then proceed to 320 and use the updated codeword as the basis for searching the set of CAM cells.

Thus, a device may use a set of possible codewords mapped to a set of valid codewords to perform error correction for a raw codeword.

In an alternative, a device may store the tables 210 but not the tables 205. In such a scenario, the device may receive a raw codeword for error correction and identify the set of CAM cells that store the valid codewords matching the size of the raw codeword. For example, if the raw codeword is three bits, the device may identify table 210-*y*. The device may then determine the Hamming distance of the raw codeword relative to the valid codewords in the table 210-*y*. For example, the device may store the raw codeword in a set of CAM cells so that the device can use associative processing to compare the raw codeword against test codewords that are within a Hamming distance of one from the valid codewords. If the device determines that the raw codeword matches one of the test codewords for a valid codeword, the device may determine that the correct value for the raw codeword is the valid codeword.

In some examples, the device may be configured to perform error correction on data that is stored in one or more planes of the device. In such a scenario, the device may perform error correction by searching for raw codewords in the plane(s) that are within a threshold Hamming distance of the valid codewords of the same size. For example, to correct raw codewords that are three bits long (where the valid codewords for three bits are those in the table 210-*y*) the device may search the plane(s) for raw three bit codewords that are within a Hamming distance of one from valid codewords '000' and '111.' To search for raw codewords that are within a Hamming distance of one from '000,' the device may search for raw codewords that match '0XX', 'X0X' and 'XX0.' Put another way, the device may search for raw codewords that have '0' in the least significant bit (LSB), may search for raw codewords that have a '0' in the intermediate bit, and may search for raw codewords that have a '0' in the most significant bit (MSB).

For each raw codeword the device may increment a respective counter if there is mismatch between the raw codeword and the searched value. Put another way, the device may use the counter for a raw codeword to keep track of the mismatches for the raw codeword and searched values. After searching the plane(s) for each value '0XX', 'X0X' and 'XX0,' the device may use the counter for each raw codeword to determine the Hamming distance of the raw codeword relative to the valid codeword '000,' which may be equal to the counter value for that raw codeword. Thus, a raw codeword with a counter value less than or equal to one may be mapped to the valid codeword associated with that counter. To complete error correction on the plane(s), the device may use a similar process for other valid codewords (e.g., valid codeword '111') that match the size of the raw codewords.

Figure 4:
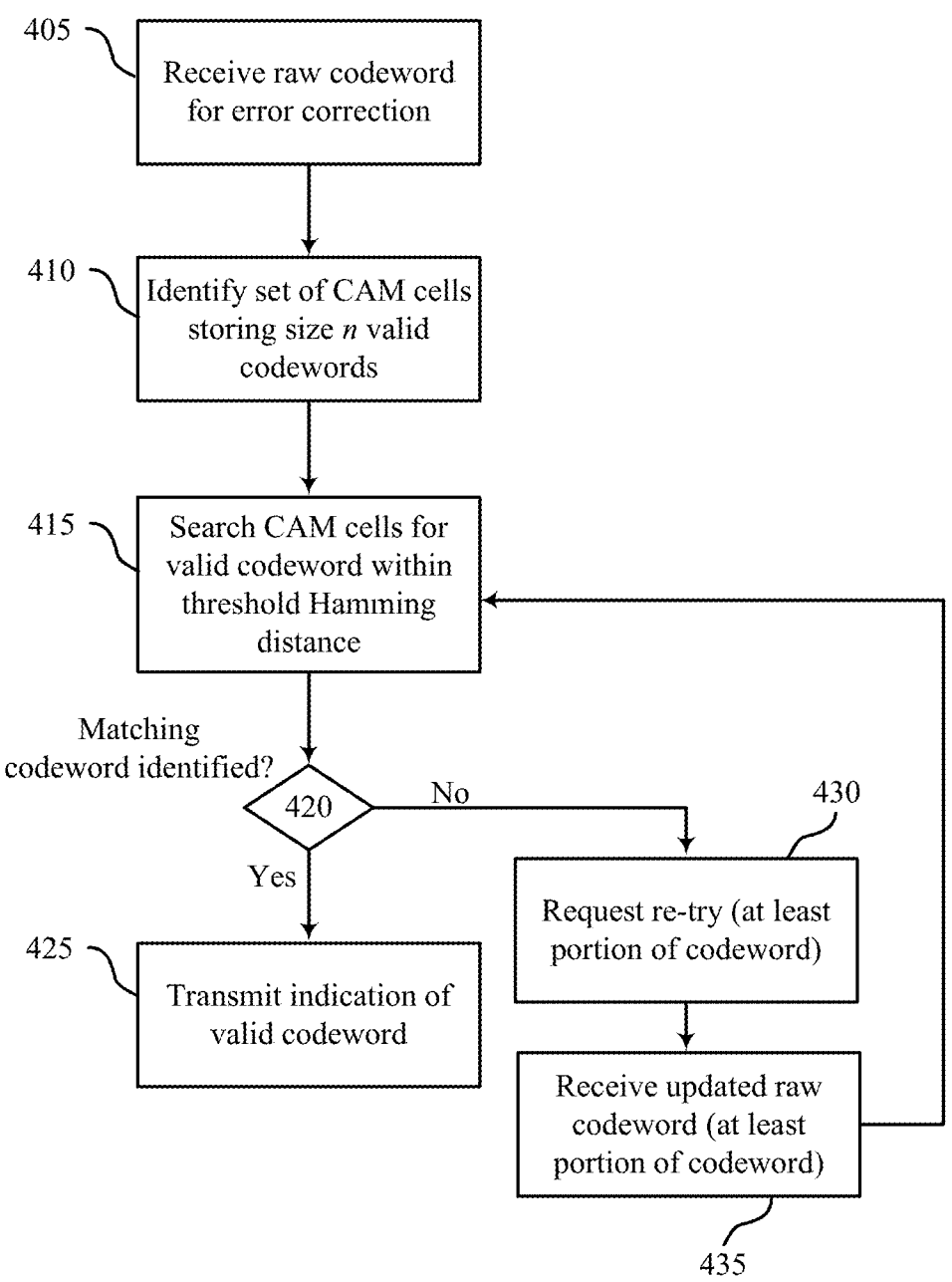
FIG. 4 illustrates an example of a process flow that supports associative computing for error correction in accordance with examples as disclosed herein.

FIG. 4 illustrates an example of a process flow 400 that supports associative computing for error correction in accordance with examples as disclosed herein. The process flow 400 may be implemented by a device such as an APM system or an APM device as described herein. The device may use CAM cells to store the entries of tables that the device uses to perform error correction operations. For example, the device may use CAM cells to store the entries of the tables 210 (but not necessarily the entries of the tables 205) as described with reference to FIG. 2. Storing the entries of the tables 210 (and but not necessarily the entries of the tables 205) may reduce the amount of memory used for error protection relative to other techniques.

At 405, the device may receive a raw (e.g., uncorrected) codeword from another device, such as the device 105. For example, the device may receive a raw codeword of size n, where n is the quantity of bits in the raw codeword. At 410, the device may identify a set of CAM cells that stores valid codewords of size n. The device may identify the set of CAM cells based on the size of the raw codeword and based on the size associated with the set of memory cells.

At 415, the device may search the set of CAM cells for a valid codeword that is within a threshold Hamming distance of the raw codeword. For example, the device may compare valid codewords in the set of CAM cells with the raw codeword.

At 420, the device may determine whether a valid codeword (that is within the threshold Hamming distance of the raw codeword) has been identified in the set of CAM cells. If, at 420, the device determines that a valid codeword (that is within the threshold Hamming distance of the raw codeword) has been identified, the device may proceed to 425 and send an indication of the valid codeword to the other device. For example, the device may send the index associated with the valid codeword or the valid codeword itself. In some examples, the device may also send the Hamming distance between the raw codeword and the valid codeword (e.g., so that the device 105 can determine whether the raw codeword is close to failing and if so, to implement remedial measures).

If, at 420, the device determines that a matching codeword has not been identified, the device may proceed to 430 and send to the other device a request for an updated raw codeword (or an updated portion of the raw codeword). At 435, the device may receive the updated raw codeword (or the updated portion of the raw codeword). The device may receive the updated raw codeword (or the updated portion of the raw codeword) based on (e.g., in response to) sending the request at 430. The device may then proceed to 415 and use the updated codeword as the basis for searching the set of CAM cells.

Thus, a device may use a set of valid codewords stored in a set of CAM cells to perform error correction for a raw codeword.

Figure 5:
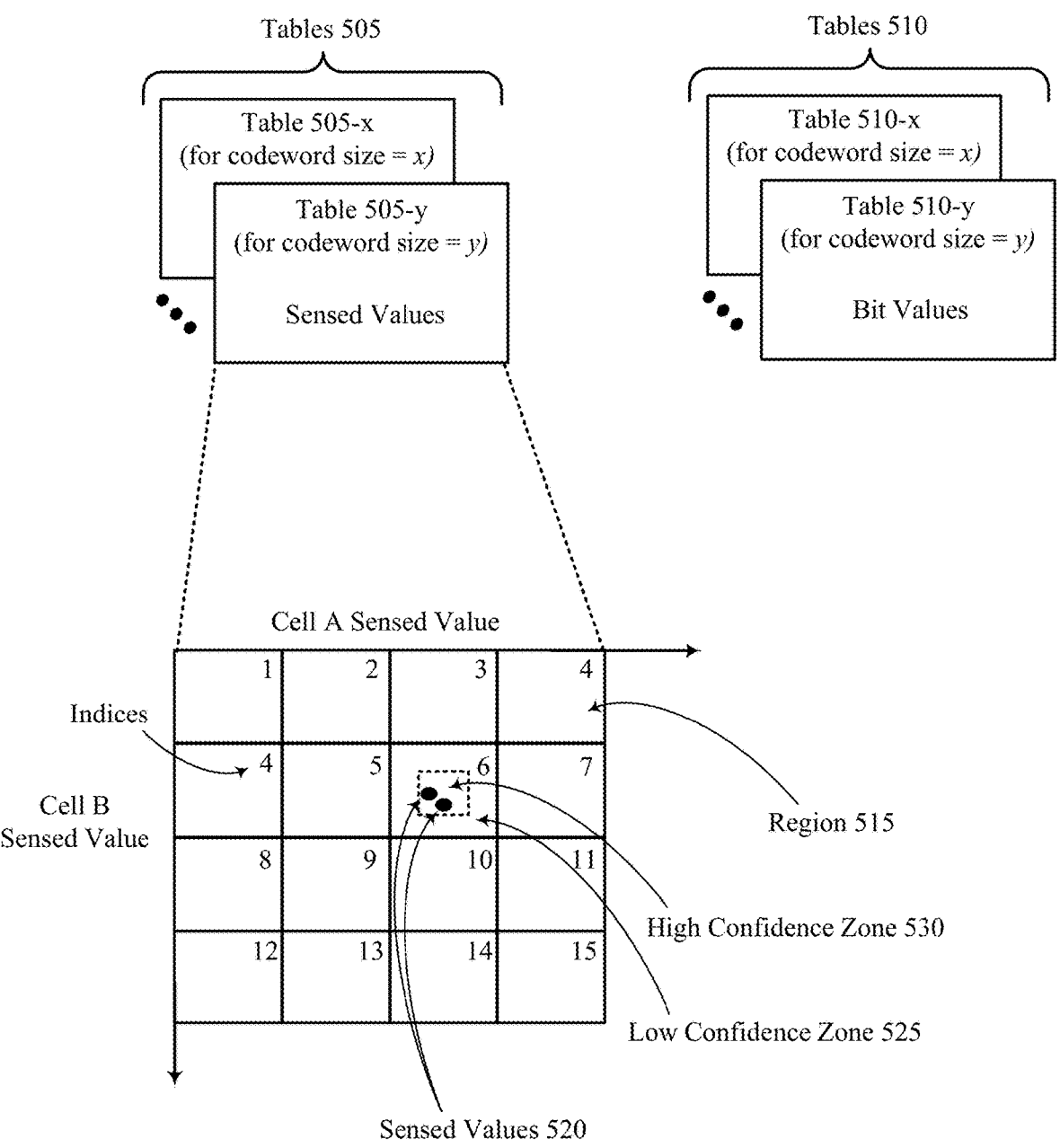
FIG. 5 illustrates an example of tables that support associative computing for error correction in accordance with examples as disclosed herein.

FIG. 5 illustrates an example of tables 500 that support associative computing for error correction in accordance with examples as disclosed herein. The tables 500 may include tables 505 and tables 510. The tables 505 may include tables 505-*x* through 505-*y* and the tables 510 may include tables 510-*x* through 510-*y*. The tables 500 may be an example of the tables 155 and thus may be stored by device such as an APM device, an APM system, or the like. For example, the APM device or system may include sets of CAM cells that store the tables (e.g., for a given table, a set of CAM cells may store the table entries as one or more vectors). The APM device may use the tables 500 to perform codeword resolution.

Each table 505 may include sets of sensed values for a codeword of a particular size. For example, table 505-*x* may include sets of sensed values for codewords of size x, and table 505-*y* may include sets of sensed values for codewords of size y, where x and y are different. Framed another way, table 505-*x* may represent a set of CAM cells that stores sets of sensed values for codewords of size x, and table 505-*y* may represent a set of CAM cells that stores sets of sensed values for codewords of size y. The quantity of sensed values for a codeword may be equal to the quantity of bits in the codeword. In addition to storing sets of sensed values, a set of CAM cells may store indices that map the sets of sensed values to sets of bit values (e.g., the bit values for codewords stored in the tables 510). So, the tables 505 may provide a mapping between analog values (e.g., sensed values) and digital values (e.g., bit values).

Each table 510 may include sets of bit values for a codeword of a particular size. For example, table 510-*x* may include sets of bit values for a codeword of size x, and table 510-*y* may include sets of bit values for a codeword of size y, where x and y are different. Framed another way, table 510-*x* may represent a set of CAM cells that stores sets of bit values for a codeword of size x, and table 510-*y* may represent a set of CAM cells that stores sets of bits values for a codeword of size y. In addition to storing sets of bit values for a codeword, a set of CAM cells may store indices that indicate and differentiate the sets of bits values.

A set of sensed values may represent the values sensed for a set of memory cells. For example, a set of sensed values may represent analog information, such as analog voltages or analog currents sensed (e.g., via one or more comparators), for a set of memory cells. The set of memory cells may be at a device such as the device 105 described with reference to FIG. 1.

The sensed values for a set of memory cells may have a statistical distribution (e.g., a Gaussian distribution, a non-Gaussian distribution) that is known to the APM device (e.g., from training). The APM device may use the statistical distribution for the set of memory cells to assign different sets of sensed values to different indices that are mapped to different codeword bit values.

To illustrate, consider an example where the codeword size y is equal to two bits. In such an example, the APM device may map the possible sensed values for the two bits to a multi-dimensional plane, such as a 2D plane. The possible sensed values for the two bits may correspond to two memory cells: memory cell A and memory cell B. The APM device may divide the multi-dimensional plane into multiple regions 515 so that various pairs of possible sensed values falls within one of the regions 515. For example, the APM device may divide the multi-dimensional plane into rectangular regions (as shown in FIG. 5) each of which is associated with a respective index that is associated with a set of bit values. Thus, multiple pairs of possible sensed values may be mapped to a particular index based on the position of the pairs within a common region 515. Although shown as rectangles, the regions 515 may be any shape and may collectively cover some or all of the multi-dimensional plane.

Upon receipt of a set of sensed values (e.g. a first sensed value and a second sensed value), the APM device may identify the region 515 within which the set of sensed values falls. For example, the APM device may search within the table 505-*y* for a matching set of sensed values and identify the index associated with the matching set of sensed values. To illustrate, if the APM device receives sensed values 520, the APM device may search the table 505-*y* to determine that the sensed values 520 fall within the region associated with index 6. The APM device may then use the index to identify a set of bit values mapped to the set of sensed values. For example, the APM device may search table 510-*y* for a matching index and identify the set of bit values associated with the index. Upon identifying the set of bit values, the APM device may send an indication of the set of bit values to the device.

In some examples, the APM device may define a low confidence zone and a high confidence zone for a region 515. For example, the APM device may define low confidence zone 525 and high confidence zone 530 for the region 515 assigned index 6. The low confidence zone 525 may include possible sensed values that are associated with a confidence level that is below a threshold confidence level, whereas the high confidence zone 530 may include possible sensed values that are associated with a confidence level that is greater than or equal to the threshold confidence level. A confidence level may refer to the likelihood that the bit values mapped to a set of sensed values are accurate (e.g., correct).

The use of confidence zones may improve reliability. For example, if a set of received sensed values falls within the low confidence zone for a region, the APM device may request that the device re-send an updated set of the sensed values. The APM device may then use the updated set of the sensed values (e.g., alone or in combination with the original set of sensed values) to determine a set of bit values. However, if a set of received sensed values falls within the high confidence zone for a region, the APM device may use the set of sensed values (without requesting an updated set of sensed values) to determine the bit values for the codeword.

Thus, an APM device may use the tables 500 to determine codeword bit values for sets of sensed values.

Figure 6:
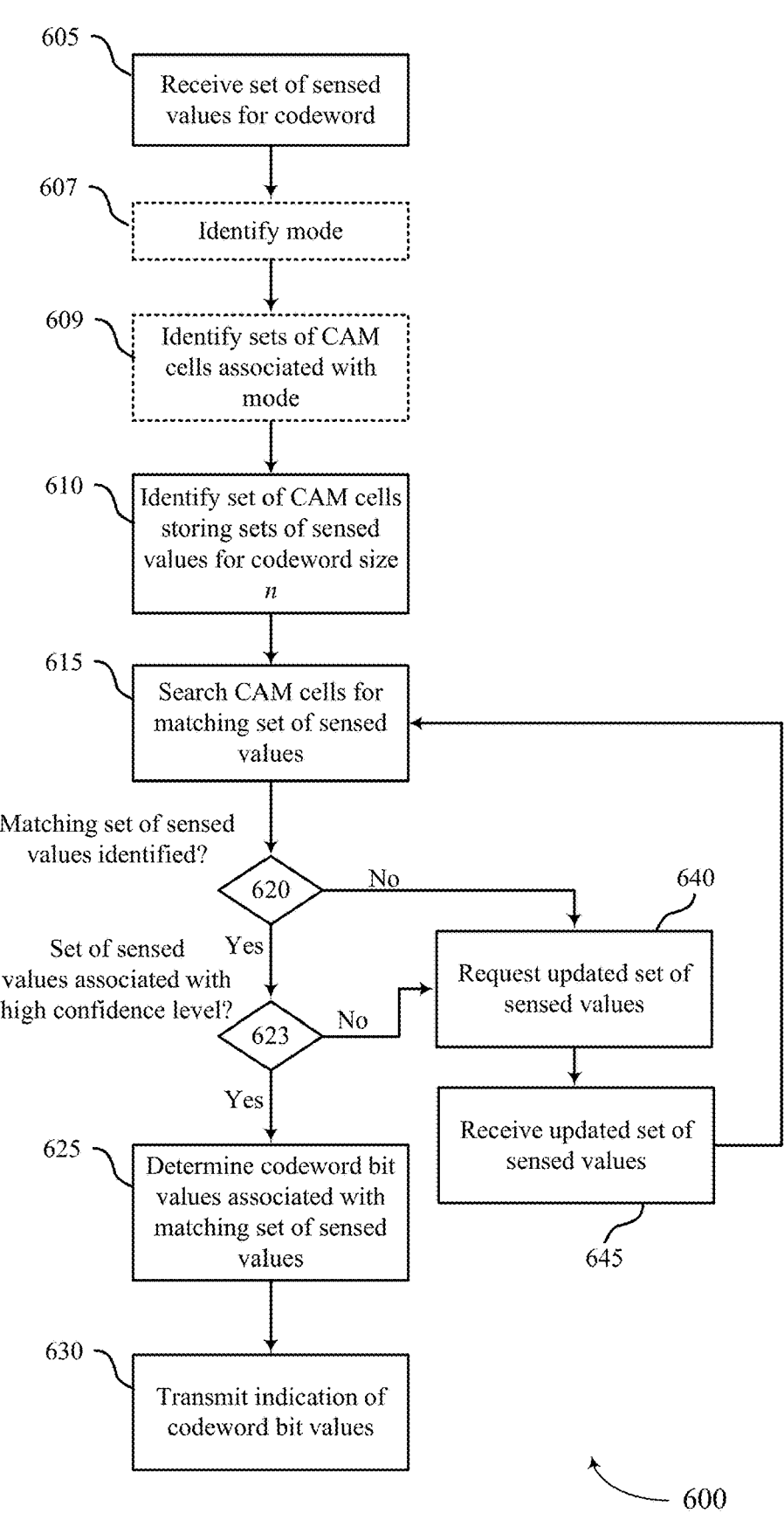
FIG. 6 illustrates an example of a process flow that supports associative computing for error correction in accordance with examples as disclosed herein.

FIG. 6 illustrates an example of a process flow 600 that supports associative computing for error correction in accordance with examples as disclosed herein. The process flow 600 may be implemented by a device such as an APM system or an APM device as described herein. The device may use CAM cells to store the entries of tables that the device uses to perform codeword resolution. For example, the device may use CAM cells to store the entries of the tables 505 and the entries of the tables 510 as described with reference to FIG. 5. Storing both the entries of the tables 505 and the entries of the tables 510 may allow the device to determine codeword bit values for a set of sensed values, which may be referred to as codeword resolution.

At 605, the device may receive a set of sensed values from another device, such as the device 105. For example, the device may receive a set of sensed values for a codeword of size n, where n is the quantity of bits in the codeword. The set of sensed values may represent the values sensed for a set of memory cells.

At 607, the device may identify a mode of the device. The device may identify the mode of the device based on various factors or metrics associated with the mode. For example, the device may define different modes that are associated with different temperatures, read operation metrics, write operation metrics, or combinations thereof, among other examples. Read operation metrics may include the quantity of read operations performed by the device within a threshold duration, the duration between read operations, or both.

Write operation metrics may include the quantity of write operations performed by the device within a threshold duration, the duration between write operations, or both. Thus, the device may identify the mode of the device based on a temperature of the device, a quantity of read operations performed by the device within a threshold duration, a quantity of write operations performed by the device within the threshold duration, a duration between read operations, a duration between write operations, or any combination thereof.

At 609, the device may identify sets of CAM cells that are associated with the mode. For example, each mode may be associated with sets of CAM cells that store the entries of tables like the tables 505 and the tables 510. In some examples, the device may use a table to identify the sets of CAM cells associated with the mode.

At 610, the device may identify a set of CAM cells. The set of content addressable memory cells may be selected from the sets of CAM cells (identified at 609) based on the size of the codeword associated with the set of sensed values. For example, if the set of sensed values if for a codeword of size n, the device may select the set of CAM cells that is associated with size n.

At 615, the device may search the set of CAM cells for a stored set of sensed values that matches (e.g., is the same value as, is equal to) the received set of sensed values. For example, the device may compare stored sets of sensed values in the set of CAM cells with the received set of sensed values. At 620, the device may determine whether a matching set of sensed values has been identified in the set of CAM cells.

If, at 620, the device determines that a matching set of sensed values has been identified, the device may proceed to 623 and determine whether the matching set of sensed values is associated with a high confidence level (e.g., a confidence level that satisfies a threshold confidence level).

If, at 623, the device determines that the matching set of sensed values is associated with the high confidence level, the device may proceed to 625 and determine a set of codeword bit values associated with (e.g., mapped to) the matching set of sensed values. For example, the device may identify an index associated with the matching set of sensed values and search a second set of content addressable memory cells (e.g., a second set of content addressable memory cells that stores the entries of a table 510 for size n) for a set of codeword bit values associated with that index. The device may identify the second set of content-addressable based on the size n. At 630, the device may transmit an indication of the set of codeword bit values to the other device.

If the device determines at 620 that a matching set of sensed values has not been identified (e.g., because the received set of sensed values falls outside of the defined regions 515)—or if the device determines at 623 that the matching set of sensed values is not associated with the high confidence level)—the device may proceed to 640. At 640, the device may send to the other device a request for an updated set of sensed values. At 645, the device may receive the updated set of sensed values. The device may receive the updated set of sensed values based on (e.g., in response to) sending the request at 640. The device may then proceed to 615 and use the updated set of sensed values (or a combination, such as an average, of the original set of sensed values and the updated set of sensed values) as the basis for searching the set of CAM cells.

Thus, the device may resolve a codeword based on a set of sensed values.

Figure 7:
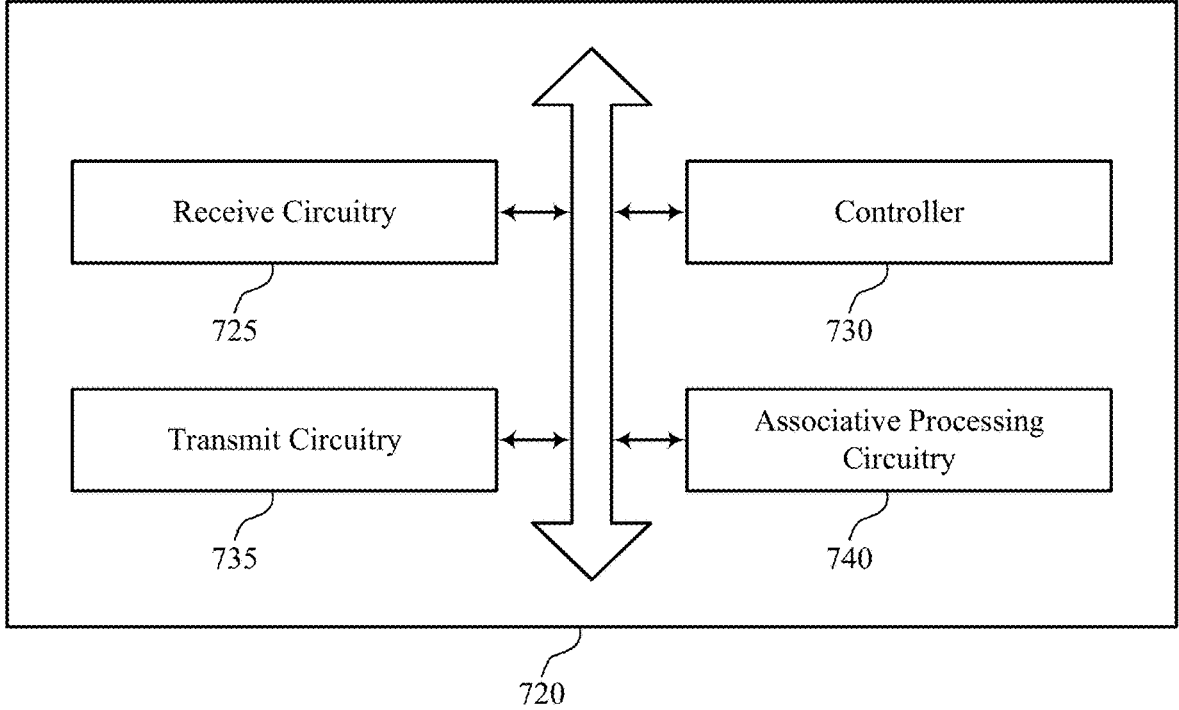
FIG. 7 shows a block diagram of a device that supports associative computing for error correction in accordance with examples as disclosed herein.

FIG. 7 shows a block diagram 700 of a device 720 that supports associative computing for error correction in accordance with examples as disclosed herein. The device 720 may be an example of aspects of a device as described with reference to FIGS. 1 through 6. The device 720, or various components thereof, may be an example of means for performing various aspects of associative computing for error correction as described herein. For example, the device 720 may include a receive circuitry 725, a controller 730, a transmit circuitry 735, an associative processing circuitry 740, or any combination thereof. Each of these components may communicate, directly or indirectly, with one another (e.g., via one or more buses).

The receive circuitry 725 may be configured as or otherwise support a means for receiving, by a first device from a second device, first data representative of a first codeword of a size for error correction. The controller 730 may be configured as or otherwise support a means for identifying a set of content-addressable memory cells that stores data representative of a set of codewords each of which is the size of the first codeword. The transmit circuitry 735 may be configured as or otherwise support a means for transmitting, to the second device based at least in part on identifying second data representative of the first codeword in the set of content-addressable memory cells, an indication of a valid codeword that is mapped to the second data.

In some examples, the associative processing circuitry 740 may be configured as or otherwise support a means for identifying an index associated with the second data based at least in part on identifying the second data, where the index indicates that the valid codeword is mapped to the second data.

In some examples, the controller 730 may be configured as or otherwise support a means for identifying a second set of content-addressable memory cells that stores data representative of a set of valid codewords of the size, where the set of valid codewords includes the valid codeword and the index indicates the valid codeword in the set of valid codewords.

In some examples, the second set of content-addressable memory cells stores a respective index for each valid codeword of the set of valid codewords, and the associative processing circuitry 740 may be configured as or otherwise support a means for searching the second set of content-addressable memory cells for the index, where the valid codeword is identified based at least in part on identifying the index in the second set of content-addressable memory cells.

In some examples, the transmit circuitry 735 may be configured as or otherwise support a means for transmitting an index that indicates the valid codeword, or transmitting data representative of the valid codeword, or both.

In some examples, the controller 730 may be configured as or otherwise support a means for determining the size of the first codeword based at least in part on receiving the first data representative of the first codeword, where the set of content-addressable memory cells is identified based at least in part on the size of the first codeword.

In some examples, the receive circuitry 725 may be configured as or otherwise support a means for receiving, from the second device, third data representative of a second codeword of the size for error correction, the second codeword different than the first codeword. In some examples, the transmit circuitry 735 may be configured as or otherwise support a means for transmitting, to the second device based at least in part on identifying fourth data representative of the second codeword in the set of content-addressable memory cells, an indication that the valid codeword that is mapped to the second codeword.

In some examples, the associative processing circuitry 740 may be configured as or otherwise support a means for searching the set of content-addressable memory cells for second data representative of the first codeword, where the second data is identified based at least in part on searching the set of content-addressable memory cells.

In some examples, the associative processing circuitry 740 may be configured as or otherwise support a means for comparing data representative of one or more codewords of the set of codewords with the first data representative of the first codeword.

In some examples, the valid codeword is included in a set of valid codewords supported by the second device, the set of valid codewords consisting of valid codewords that are separated by more than a threshold Hamming distance.

In some examples, the first codeword is within the threshold Hamming distance relative to the valid codeword. In some examples, the valid codewords of the set of valid codewords are each of the size.

In some examples, the set of content-addressable memory cells indicates mappings between valid codewords and codewords of the set of codewords that are within the threshold Hamming distance of the valid codewords. In some examples, each codeword of the set of codewords satisfies multiple Hamming distance requirements relative to the set of valid codewords.

In some examples, the receive circuitry 725 may be configured as or otherwise support a means for receiving, by a first device from a second device, first data representative of a codeword of a size for error correction. In some examples, the controller 730 may be configured as or otherwise support a means for identifying a set of content-addressable memory cells that stores data representative of a set of valid codewords each of which is the size of the codeword. In some examples, the transmit circuitry 735 may be configured as or otherwise support a means for transmitting, based at least in part on identifying, in the set of content-addressable memory cells, second data representative of a valid codeword that is within a threshold Hamming distance relative to the codeword, an indication of the valid codeword to the second device.

In some examples, the controller 730 may be configured as or otherwise support a means for determining the size of the codeword based at least in part on receiving the first data representative of the codeword, where the set of content-addressable memory cells is identified based at least in part on the size.

In some examples, receiving, from the second device, second data representative of a second codeword of the size for error correction, the second codeword different than the codeword and within the threshold Hamming distance of the valid codeword. In some examples, transmitting, to the second device based at least in part on identifying second data representative of a valid codeword that is within the threshold Hamming distance relative to the second codeword in the set of content-addressable memory cells, an indication that the second codeword maps to the valid codeword.

In some examples, the associative processing circuitry 740 may be configured as or otherwise support a means for searching the set of content-addressable memory cells for the second data representative of the valid codeword that is within a threshold Hamming distance relative to the codeword.

In some examples, the associative processing circuitry 740 may be configured as or otherwise support a means for comparing data representative of one or more codewords of the set of valid codewords with the first data representative of the codeword.

In some examples, each valid codeword in the set of valid codewords is separated by more than the threshold Hamming distance relative to other valid codewords in the set of valid codewords. In some examples, the associative processing circuitry 740 may be configured as or otherwise support a means for identifying an index associated with the valid codeword based at least in part on identifying the second data representative of the valid codeword, where transmitting the indication includes transmitting the index. In some examples, the transmit circuitry 735 may be configured as or otherwise support a means for transmitting the second data representative of the valid codeword.

In some examples, the receive circuitry 725 may be configured as or otherwise support a means for receiving, by a first device from a second device, first data representative of a set of sensed values for a set of memory cells. In some examples, the controller 730 may be configured as or otherwise support a means for identifying a set of content-addressable memory cells that stores data representative of sets of sensed values that are mapped to indices associated with different sets of bit values for a codeword. In some examples, the transmit circuitry 735 may be configured as or otherwise support a means for transmitting, to the second device based at least in part on identifying in the set of content-addressable memory cells an index associated with second data representative of the set of sensed values, an indication of a set of bit values, for the codeword, that is associated with the index.

In some examples, the set of sensed values includes analog values each represented by a respective set of bits. In some examples, the associative processing circuitry 740 may be configured as or otherwise support a means for searching the set of content-addressable memory cells for second data representative of the set of sensed values, where the index is identified based at least in part on searching the set of content-addressable memory cells.

In some examples, the first device includes multiple sets of content-addressable memory cells each associated with a respective mode of the first device, and the controller 730 may be configured as or otherwise support a means for identifying a mode of the first device, where the set of content-addressable memory cells is identified from the multiple sets of content-addressable memory cells based at least in part on the mode of the first device.

In some examples, the mode of the first device is identified based at least in part on a temperature of the first device, a quantity of read operations performed by the first device within a threshold duration, a quantity of write operations performed by the first device within the threshold duration, a duration between read operations, a duration between write operations, or any combination thereof.

In some examples, the associative processing circuitry 740 may be configured as or otherwise support a means for identifying data representative of the mode in a second set of content-addressable memory cells that stores data representative of the respective modes. In some examples, the associative processing circuitry 740 may be configured as or otherwise support a means for identifying a second index that that is associated with the data representative of the mode and that maps the mode to the set of content-addressable memory cells, where the set of content-addressable memory cells is identified based at least in part on the second index.

In some examples, the controller 730 may be configured as or otherwise support a means for determining that a confidence level associated with the second data is greater than or equal to a threshold confidence level, where the indication of the set of bit values is sent based at least in part the confidence level being greater than or equal to the threshold confidence level. In some examples, the transmit circuitry 735 may be configured as or otherwise support a means for transmitting the index associated with the set of bit values, or transmitting the set of bit values, or both.

FIG. 8 shows a flowchart illustrating a method 800 that supports associative computing for error correction in accordance with examples as disclosed herein. The operations of method 800 may be implemented by a device or its components as described herein. For example, the operations of method 800 may be performed by a device as described with reference to FIGS. 1 through 7. In some examples, a device may execute a set of instructions to control the functional elements of the device to perform the described functions. Additionally or alternatively, the device may perform aspects of the described functions using special-purpose hardware.

At 805, the method may include receiving, by a first device from a second device, first data representative of a first codeword of a size for error correction. The operations of 805 may be performed in accordance with examples as disclosed herein. In some examples, aspects of the operations of 805 may be performed by a receive circuitry 725 as described with reference to FIG. 7.

At 810, the method may include identifying a set of content-addressable memory cells that stores data representative of a set of codewords each of which is the size of the first codeword. The operations of 810 may be performed in accordance with examples as disclosed herein. In some examples, aspects of the operations of 810 may be performed by a controller 730 as described with reference to FIG. 7.

At 815, the method may include transmitting, to the second device based at least in part on identifying second data representative of the first codeword in the set of content-addressable memory cells, an indication of a valid codeword that is mapped to the second data. The operations of 815 may be performed in accordance with examples as disclosed herein. In some examples, aspects of the operations of 815 may be performed by a transmit circuitry 735 as described with reference to FIG. 7.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving, by a first device from a second device, first data representative of a first codeword of a size for error correction; identifying a set of content-addressable memory cells that stores data representative of a set of codewords each of which is the size of the first codeword; and transmitting, to the second device based at least in part on identifying second data representative of the first codeword in the set of content-addressable memory cells, an indication of a valid codeword that is mapped to the second data.

Aspect 2: The method, apparatus, or non-transitory computer-readable medium of aspect 1, further including operations, features, circuitry, logic, means, or instructions, or any combination thereof for identifying an index associated with the second data based at least in part on identifying the second data, where the index indicates that the valid codeword is mapped to the second data.

Aspect 3: The method, apparatus, or non-transitory computer-readable medium of aspect 2, further including operations, features, circuitry, logic, means, or instructions, or any combination thereof for identifying a second set of content-addressable memory cells that stores data representative of a set of valid codewords of the size, where the set of valid codewords includes the valid codeword and the index indicates the valid codeword in the set of valid codewords.

Aspect 4: The method, apparatus, or non-transitory computer-readable medium of aspect 3 where the second set of content-addressable memory cells stores a respective index for each valid codeword of the set of valid codewords and the method, apparatuses, and non-transitory computer-readable medium, further includes operations, features, circuitry, logic, means, or instructions, or any combination thereof for searching the second set of content-addressable memory cells for the index, where the valid codeword is identified based at least in part on identifying the index in the second set of content-addressable memory cells.

Aspect 5: The method, apparatus, or non-transitory computer-readable medium of any of aspects 1 through 4, further including operations, features, circuitry, logic, means, or instructions, or any combination thereof for transmitting an index that indicates the valid codeword, or transmitting data representative of the valid codeword, or both.

Aspect 6: The method, apparatus, or non-transitory computer-readable medium of any of aspects 1 through 5, further including operations, features, circuitry, logic, means, or instructions, or any combination thereof for determining the size of the first codeword based at least in part on receiving the first data representative of the first codeword, where the set of content-addressable memory cells is identified based at least in part on the size of the first codeword.

Aspect 7: The method, apparatus, or non-transitory computer-readable medium of any of aspects 1 through 6, further including operations, features, circuitry, logic, means, or instructions, or any combination thereof for receiving, from the second device, third data representative of a second codeword of the size for error correction, the second codeword different than the first codeword and transmitting, to the second device based at least in part on identifying fourth data representative of the second codeword in the set of content-addressable memory cells, an indication that the valid codeword that is mapped to the second codeword.

Aspect 8: The method, apparatus, or non-transitory computer-readable medium of any of aspects 1 through 7, further including operations, features, circuitry, logic, means, or instructions, or any combination thereof for searching the set of content-addressable memory cells for second data representative of the first codeword, where the second data is identified based at least in part on searching the set of content-addressable memory cells.

Aspect 9: The method, apparatus, or non-transitory computer-readable medium of aspect 8, further including operations, features, circuitry, logic, means, or instructions, or any combination thereof for comparing data representative of one or more codewords of the set of codewords with the first data representative of the first codeword.

Aspect 10: The method, apparatus, or non-transitory computer-readable medium of any of aspects 1 through 9 where the valid codeword is included in a set of valid codewords supported by the second device, the set of valid codewords consisting of valid codewords that are separated by more than a threshold Hamming distance.

Aspect 11: The method, apparatus, or non-transitory computer-readable medium of aspect 10 where the first codeword is within the threshold Hamming distance relative to the valid codeword.

Aspect 12: The method, apparatus, or non-transitory computer-readable medium of any of aspects 10 through 11 where the valid codewords of the set of valid codewords are each of the size.

Aspect 13: The method, apparatus, or non-transitory computer-readable medium of any of aspects 10 through 12 where the set of content-addressable memory cells indicates mappings between valid codewords and codewords of the set of codewords that are within the threshold Hamming distance of the valid codewords.

Aspect 14: The method, apparatus, or non-transitory computer-readable medium of any of aspects 10 through 13 where each codeword of the set of codewords satisfies multiple Hamming distance requirements relative to the set of valid codewords.

FIG. 9 shows a flowchart illustrating a method 900 that supports associative computing for error correction in accordance with examples as disclosed herein. The operations of method 900 may be implemented by a device or its components as described herein. For example, the operations of method 900 may be performed by a device as described with reference to FIGS. 1 through 7. In some examples, a device may execute a set of instructions to control the functional elements of the device to perform the described functions. Additionally or alternatively, the device may perform aspects of the described functions using special-purpose hardware.

At 905, the method may include receiving, by a first device from a second device, first data representative of a codeword of a size for error correction. The operations of 905 may be performed in accordance with examples as disclosed herein. In some examples, aspects of the operations of 905 may be performed by a receive circuitry 725 as described with reference to FIG. 7.

At 910, the method may include identifying a set of content-addressable memory cells that stores data representative of a set of valid codewords each of which is the size of the codeword. The operations of 910 may be performed in accordance with examples as disclosed herein. In some examples, aspects of the operations of 910 may be performed by a controller 730 as described with reference to FIG. 7.

At 915, the method may include transmitting, based at least in part on identifying, in the set of content-addressable memory cells, second data representative of a valid codeword that is within a threshold Hamming distance relative to the codeword, an indication of the valid codeword to the second device. The operations of 915 may be performed in accordance with examples as disclosed herein. In some examples, aspects of the operations of 915 may be performed by a transmit circuitry 735 as described with reference to FIG. 7.

In some examples, an apparatus as described herein may perform a method or methods, such as the method 900. The apparatus may include features, circuitry, logic, means, or instructions (e.g., a non-transitory computer-readable medium storing instructions executable by a processor), or any combination thereof for performing the following aspects of the present disclosure:

Aspect 15: A method, apparatus, or non-transitory computer-readable medium including operations, features, circuitry, logic, means, or instructions, or any combination thereof for receiving, by a first device from a second device, first data representative of a codeword of a size for error correction; identifying a set of content-addressable memory cells that stores data representative of a set of valid codewords each of which is the size of the codeword; and transmitting, based at least in part on identifying, in the set of content-addressable memory cells, second data representative of a valid codeword that is within a threshold Hamming distance relative to the codeword, an indication of the valid codeword to the second device.

Aspect 16: The method, apparatus, or non-transitory computer-readable medium of aspect 15, further including operations, features, circuitry, logic, means, or instructions, or any combination thereof for determining the size of the codeword based at least in part on receiving the first data representative of the codeword, where the set of content-addressable memory cells is identified based at least in part on the size.

Aspect 17: The method, apparatus, or non-transitory computer-readable medium of any of aspects 15 through 16 where receiving, from the second device, second data representative of a second codeword of the size for error correction, the second codeword different than the codeword and within the threshold Hamming distance of the valid codeword and transmitting, to the second device based at least in part on identifying second data representative of a valid codeword that is within the threshold Hamming distance relative to the second codeword in the set of content-addressable memory cells, an indication that the second codeword maps to the valid codeword.

Aspect 18: The method, apparatus, or non-transitory computer-readable medium of any of aspects 15 through 17, further including operations, features, circuitry, logic, means, or instructions, or any combination thereof for searching the set of content-addressable memory cells for the second data representative of the valid codeword that is within a threshold Hamming distance relative to the codeword.

Aspect 19: The method, apparatus, or non-transitory computer-readable medium of aspect 18, further including operations, features, circuitry, logic, means, or instructions, or any combination thereof for comparing data representative of one or more codewords of the set of valid codewords with the first data representative of the codeword.

Aspect 20: The method, apparatus, or non-transitory computer-readable medium of any of aspects 15 through 19 where each valid codeword in the set of valid codewords is separated by more than the threshold Hamming distance relative to other valid codewords in the set of valid codewords.

Aspect 21: The method, apparatus, or non-transitory computer-readable medium of any of aspects 15 through 20, further including operations, features, circuitry, logic, means, or instructions, or any combination thereof for identifying an index associated with the valid codeword based at least in part on identifying the second data representative of the valid codeword, where transmitting the indication includes transmitting the index.

Aspect 22: The method, apparatus, or non-transitory computer-readable medium of any of aspects 15 through 21, further including operations, features, circuitry, logic, means, or instructions, or any combination thereof for transmitting the second data representative of the valid codeword.

FIG. 10 shows a flowchart illustrating a method 1000 that supports associative computing for error correction in accordance with examples as disclosed herein. The operations of method 1000 may be implemented by a device or its components as described herein. For example, the operations of method 1000 may be performed by a device as described with reference to FIGS. 1 through 7. In some examples, a device may execute a set of instructions to control the functional elements of the device to perform the described functions. Additionally or alternatively, the device may perform aspects of the described functions using special-purpose hardware.

At 1005, the method may include receiving, by a first device from a second device, first data representative of a set of sensed values for a set of memory cells. The operations of 1005 may be performed in accordance with examples as disclosed herein. In some examples, aspects of the operations of 1005 may be performed by a receive circuitry 725 as described with reference to FIG. 7.

At 1010, the method may include identifying a set of content-addressable memory cells that stores data representative of sets of sensed values that are mapped to indices associated with different sets of bit values for a codeword. The operations of 1010 may be performed in accordance with examples as disclosed herein. In some examples, aspects of the operations of 1010 may be performed by a controller 730 as described with reference to FIG. 7.

At 1015, the method may include transmitting, to the second device based at least in part on identifying in the set of content-addressable memory cells an index associated with second data representative of the set of sensed values, an indication of a set of bit values, for the codeword, that is associated with the index. The operations of 1015 may be performed in accordance with examples as disclosed herein. In some examples, aspects of the operations of 1015 may be performed by a transmit circuitry 735 as described with reference to FIG. 7.

In some examples, an apparatus as described herein may perform a method or methods, such as the method 1000. The apparatus may include features, circuitry, logic, means, or instructions (e.g., a non-transitory computer-readable medium storing instructions executable by a processor), or any combination thereof for performing the following aspects of the present disclosure:

Aspect 23: A method, apparatus, or non-transitory computer-readable medium including operations, features, circuitry, logic, means, or instructions, or any combination thereof for receiving, by a first device from a second device, first data representative of a set of sensed values for a set of memory cells; identifying a set of content-addressable memory cells that stores data representative of sets of sensed values that are mapped to indices associated with different sets of bit values for a codeword; and transmitting, to the second device based at least in part on identifying in the set of content-addressable memory cells an index associated with second data representative of the set of sensed values, an indication of a set of bit values, for the codeword, that is associated with the index.

Aspect 24: The method, apparatus, or non-transitory computer-readable medium of aspect 23 where the set of sensed values includes analog values each represented by a respective set of bits.

Aspect 25: The method, apparatus, or non-transitory computer-readable medium of any of aspects 23 through 24, further including operations, features, circuitry, logic, means, or instructions, or any combination thereof for searching the set of content-addressable memory cells for second data representative of the set of sensed values, where the index is identified based at least in part on searching the set of content-addressable memory cells.

Aspect 26: The method, apparatus, or non-transitory computer-readable medium of any of aspects 23 through 25 where the first device includes multiple sets of content-addressable memory cells each associated with a respective mode of the first device and the method, apparatuses, and non-transitory computer-readable medium, further includes operations, features, circuitry, logic, means, or instructions, or any combination thereof for identifying a mode of the first device, where the set of content-addressable memory cells is identified from the multiple sets of content-addressable memory cells based at least in part on the mode of the first device.

Aspect 27: The method, apparatus, or non-transitory computer-readable medium of aspect 26 where the mode of the first device is identified based at least in part on a temperature of the first device, a quantity of read operations performed by the first device within a threshold duration, a quantity of write operations performed by the first device within the threshold duration, a duration between read operations, a duration between write operations, or any combination thereof.

Aspect 28: The method, apparatus, or non-transitory computer-readable medium of any of aspects 26 through 27, further including operations, features, circuitry, logic, means, or instructions, or any combination thereof for identifying data representative of the mode in a second set of content-addressable memory cells that stores data representative of the respective modes and identifying a second index that that is associated with the data representative of the mode and that maps the mode to the set of content-addressable memory cells, where the set of content-addressable memory cells is identified based at least in part on the second index.

Aspect 29: The method, apparatus, or non-transitory computer-readable medium of any of aspects 23 through 28, further including operations, features, circuitry, logic, means, or instructions, or any combination thereof for determining that a confidence level associated with the second data is greater than or equal to a threshold confidence level, where the indication of the set of bit values is sent based at least in part the confidence level being greater than or equal to the threshold confidence level.

Aspect 30: The method, apparatus, or non-transitory computer-readable medium of any of aspects 23 through 29, further including operations, features, circuitry, logic, means, or instructions, or any combination thereof for transmitting the index associated with the set of bit values, or transmitting the set of bit values, or both.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 31: An apparatus, including: a memory die including a plurality of planes arranged in a plurality of tiles, of the plurality of planes including content-addressable memory cells; and logic coupled with the memory die and configured to: receive, from another device, first data representative of a first codeword of a size for error correction; identify a set of content-addressable memory cells that stores data representative of a set of codewords each of which is the size of the first codeword; and transmit, to the other device based at least in part on identifying second data representative of the first codeword in the set of content-addressable memory cells, an indication of a valid codeword that is mapped to the second data.

An apparatus is described. The following provides an overview of aspects of the apparatus as described herein:

Aspect 32: An apparatus, including: a memory die including a plurality of planes arranged in a plurality of tiles, of the plurality of planes including content-addressable memory cells; and logic coupled with the memory die and configured to: receive, from another device, first data representative of a codeword of a size for error correction; identify a set of content-addressable memory cells that stores data representative of a set of valid codewords each of which is the size of the codeword; based at least in part on identifying, in the set of content-addressable memory cells, second data representative of a valid codeword that is within a threshold Hamming distance relative to the codeword, an indication of the valid codeword to the other device.

An apparatus is described. The following provides an overview of aspects of the apparatus as described herein:

Aspect 33: An apparatus, including: a memory die including a plurality of planes arranged in a plurality of tiles, of the plurality of planes including content-addressable memory cells; and logic coupled with the memory die and configured to: receive, from another device, first data representative of a set of sensed values for a set of memory cells; a set of content-addressable memory cells that stores data representative of sets of sensed values that are mapped to indices associated with different sets of bit values for a codeword; and transmit, to the other device based at least in part on identifying in the set of content-addressable memory cells an index associated with second data representative of the set of sensed values, an indication of a set of bit values, for the codeword, that is associated with the index.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

Two or more actions may occur "in parallel" if the actions occur at the same time, at substantially the same time, at partially overlapping times, or at wholly overlapping times.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   storing data representative of a set of valid codewords in a set of content-addressable memory cells;
   receiving first data representative of a codeword of a size for error correction in accordance with storing the data representative of the set of valid codewords in the set of content-addressable memory cells;
   identifying the set of content-addressable memory cells that stores the data representative of the set of valid codewords each of which is the size of the codeword;
   storing, using the set of content-addressable memory cells, a first set of entries associated with a first table to perform an error correction operation based on identifying the set of content-addressable memory cells;
   storing, using the set of content-addressable memory cells, a second set of entries associated with a second table to perform the error correction operation based on storing the first set of entries;
   identifying second data in the set of content-addressable memory cells based on the first data; and
   transmitting an indication of a valid codeword that is mapped to the second data based on identifying the second data.

2. The method of claim 1, wherein the second data is representative of the valid codeword that is within a threshold Hamming distance relative to the codeword.

3. The method of claim 1, wherein the first data further is representative of a set of sensed values for a set of memory cells.

4. The method of claim 1, further comprising:
   identifying that the set of content-addressable memory cells stores data representative of sets of sensed values that are mapped to indices associated with different sets of bit values for the codeword based on identifying the set of content-addressable memory cells.

5. The method of claim 1, further comprising:
   identifying, in the set of content-addressable memory cells, an index associated with the second data based on identifying the second data.

6. The method of claim 5, further comprising:
   transmitting an indication of a set of bit values for the codeword based on identifying the index.

7. A method, comprising:
   storing data representative of a set of valid codewords in a set of content-addressable memory cells;
   receiving first data representative of a codeword of a size for error correction in accordance with storing the data representative of the set of valid codewords in the set of content-addressable memory cells;
   identifying the set of content-addressable memory cells based on receiving the first data;
   storing, using the set of content-addressable memory cells, a first set of entries associated with a first table to perform an error correction operation based on identifying the set of content-addressable memory cells;
   storing, using the set of content-addressable memory cells, a second set of entries associated with a second table to perform the error correction operation based on storing the first set of entries;
   determining whether a second codeword of a size for error correction is identified in the set of content-addressable memory cells based on the first data; and
   determining whether to transmit an indication of a valid codeword based on the second codeword.

8. The method of claim 7, further comprising:
   determining that the valid codeword is mapped to the second codeword based on determining that the second codeword is identified in the set of content-addressable memory cells.

9. The method of claim 7, further comprising:
   identifying an index associated with the second codeword based on determining that the second codeword is identified in the set of content-addressable memory cells; and
   searching a second set of content-addressable memory cells for the valid codeword associated with the index.

10. The method of claim 7, further comprising:
    transmitting a request for an updated portion of the first data based on determining that the second codeword is not identified in the set of content-addressable memory cells.

11. The method of claim 7, further comprising:

receiving an updated portion of the first data based on determining that the second codeword is not identified in the set of content-addressable memory cells.

12. The method of claim 7, further comprising:

transmitting the indication of the valid codeword based on determining that the second codeword is identified in the set of content-addressable memory cells.

13. The method of claim 7, further comprising:

identifying, in the set of content-addressable memory cells, second data representative of the valid codeword that is within a threshold Hamming distance relative to the codeword.

14. A method, comprising:

storing data representative of a set of valid codewords in a set of content-addressable memory cells;

receiving first data representative of a set of sensed values for a set of memory cells in accordance with storing the data representative of the set of valid codewords in the set of content-addressable memory cells;

identifying the set of content-addressable memory cells based on receiving the first data;

storing, using the set of content-addressable memory cells, a first set of entries associated with a first table to perform an error correction operation based on identifying the set of content-addressable memory cells;

storing, using the set of content-addressable memory cells, a second set of entries associated with a second table to perform the error correction operation based on storing the first set of entries;

determining whether a second set of sensed values for the set of memory cells is identified in the set of content-addressable memory cells; and determining whether to transmit an indication of a set of bit values based on the second set of sensed values.

15. The method of claim 14, further comprising:

transmitting a request for an updated set of sensed values based on determining that the second set of sensed values is not identified in the set of content-addressable memory cells.

16. The method of claim 14, further comprising:

receiving an updated portion of the set of sensed values based on determining that the second set of sensed values is not identified in the set of content-addressable memory cells.

17. The method of claim 14, further comprising:

determining whether a confidence value associated with the second set of sensed values satisfies a threshold based on determining that the second set of sensed values is identified in the set of content-addressable memory cells.

18. The method of claim 17, further comprising:

transmitting the indication of the set of bit values is based on determining that the confidence value associated with the second set of sensed values satisfies the threshold.

* * * * *